United States Patent
Sasaki et al.

(10) Patent No.: US 9,982,170 B2
(45) Date of Patent: May 29, 2018

(54) ELECTRO-CONDUCTIVE PRESSURE-SENSITIVE ADHESIVE TAPE, AN ELECTRONIC MEMBER, AND A PRESSURE-SENSITIVE ADHESIVE

(71) Applicant: NITTO DENKO CORPORATION, Ibaraki-shi, Osaka (JP)

(72) Inventors: Shu Sasaki, Ibaraki (JP); Jyunichi Nakayama, Ibaraki (JP); Rie Yuto, Ibaraki (JP); Yoshio Terada, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 679 days.

(21) Appl. No.: 14/553,532

(22) Filed: Nov. 25, 2014

(65) Prior Publication Data
US 2015/0147556 A1    May 28, 2015

(30) Foreign Application Priority Data

Nov. 27, 2013 (JP) .................................. 2013-245230
Nov. 6, 2014 (JP) .................................. 2014-226174

(51) Int. Cl.
*B32B 5/16* (2006.01)
*C09J 9/02* (2006.01)
(Continued)

(52) U.S. Cl.
CPC . *C09J 9/02* (2013.01); *C09J 7/00* (2013.01); *C09J 7/10* (2018.01); *C09J 11/00* (2013.01);
(Continued)

(58) Field of Classification Search
CPC ....... C09J 11/00; C09J 7/00; C09J 9/02; C09J 133/08; C09J 2201/602; C09J 2201/606;
(Continued)

(56) References Cited

U.S. PATENT DOCUMENTS 3,762,946 A * 10/1973 Stow ..................... H05K 3/242
                                                              428/551
5,965,064 A   10/1999 Yamada et al.
(Continued)

FOREIGN PATENT DOCUMENTS

JP    11-241054 A    9/1999
JP   2002-212518 A   7/2002
(Continued)

OTHER PUBLICATIONS

Definition of Roughly.*
(Continued)

*Primary Examiner* — Maria V Ewald
*Assistant Examiner* — Travis M Figg
(74) *Attorney, Agent, or Firm* — Sughrue Mion, PLLC

(57) ABSTRACT

An electro-conductive pressure-sensitive adhesive tape comprises a pressure-sensitive adhesive layer containing a resin component and an electro-conductive particle. The electro-conductive particle has at least one peak top existing in a particle size range from about 15 μm or more to about 50 μm or less and at least one further peak top existing in a particle size range from about 1 μm or more to about 12 μm or less in a particle size distribution curve thereof. The electro-conductive particle is contained in the pressure-sensitive adhesive layer in an amount of 40 mass % or more but 80 mass % or less, and has a true density in a level of larger than zero but smaller than 8 g/cm³.

15 Claims, 6 Drawing Sheets

(51) Int. Cl.
- *C09J 7/00* (2018.01)
- *C09J 11/00* (2006.01)
- C09J 133/08 (2006.01)
- C08K 7/16 (2006.01)
- C08K 9/02 (2006.01)
- H05K 3/32 (2006.01)

(52) U.S. Cl.
CPC ............... *C08K 7/16* (2013.01); *C08K 9/02* (2013.01); *C08K 2201/001* (2013.01); *C08K 2201/005* (2013.01); *C09J 133/08* (2013.01); *C09J 2201/602* (2013.01); *C09J 2201/606* (2013.01); *C09J 2201/622* (2013.01); *C09J 2203/326* (2013.01); *C09J 2433/00* (2013.01); *G02F 2202/16* (2013.01); *G02F 2202/28* (2013.01); *H05K 3/323* (2013.01); *Y10T 428/25* (2015.01); *Y10T 428/256* (2015.01)

(58) Field of Classification Search
CPC ........... C09J 2201/622; C09J 2203/326; C09J 2433/00; C09J 11/02–11/08; C09J 7/0217; C08K 2201/001; C08K 2201/005; C08K 7/16; C08K 9/02; C08K 7/18–7/20; C08K 7/28; G02F 2202/16; G02F 2202/28; H05K 3/323; Y10T 428/25; Y10T 428/256; Y10T 428/252; Y10T 428/254; Y10T 428/28; Y10T 428/29; Y10T 428/2982; Y10T 428/2991–428/2998
See application file for complete search history.

(56) References Cited

U.S. PATENT DOCUMENTS

| | | | |
|---|---|---|---|
| 6,115,575 A * | 9/2000 | Kinoshita | G03G 15/0818 399/286 |
| 6,777,464 B1 | 8/2004 | Watanabe et al. | |
| 9,153,354 B2 | 10/2015 | Baran et al. | |
| 2004/0222408 A1 | 11/2004 | Watanabe et al. | |
| 2005/0085578 A1 | 4/2005 | Iguchi | |
| 2006/0014860 A1 | 1/2006 | Watanabe et al. | |
| 2006/0060969 A1 | 3/2006 | Watanabe et al. | |
| 2006/0063366 A1 | 3/2006 | Watanabe et al. | |
| 2006/0141192 A1 | 6/2006 | Divigalpitiya et al. | |
| 2007/0164260 A1 * | 7/2007 | Kuwajima | H01B 1/02 252/512 |
| 2007/0299172 A1 | 12/2007 | Watanabe et al. | |
| 2008/0054225 A1 | 3/2008 | Watanabe et al. | |
| 2008/0064233 A1 | 3/2008 | Watanabe et al. | |
| 2008/0078977 A1 * | 4/2008 | Hashiba | C08J 3/12 252/500 |
| 2010/0209699 A1 * | 8/2010 | Nakayama | C09J 7/0217 428/323 |
| 2010/0323198 A1 * | 12/2010 | Kuwajima | H01B 1/02 428/402 |
| 2011/0318569 A1 * | 12/2011 | Kobayashi | C08J 9/0066 428/317.3 |
| 2012/0121900 A1 * | 5/2012 | Niwa | C09J 7/26 428/355 AC |
| 2012/0295052 A1 * | 11/2012 | Choi | B32L 35/022 428/40.9 |
| 2012/0313056 A1 * | 12/2012 | Baran | H01B 1/22 252/519.21 |

FOREIGN PATENT DOCUMENTS

| | | | | |
|---|---|---|---|---|
| JP | 2004-263030 A | | 9/2004 | |
| JP | 2004263030 A | * | 9/2004 | |
| JP | 2004263030 A | * | 9/2004 | |
| JP | 2005-054157 A | | 3/2005 | |
| JP | 2006-510762 A | | 3/2006 | |
| JP | 2006-124531 A | | 5/2006 | |
| JP | 2006-199825 A | | 8/2006 | |
| JP | 2007-211122 A | | 8/2007 | |
| JP | 2008-525579 A1 | | 7/2008 | |
| JP | 2009-079127 A | | 4/2009 | |
| JP | 2010-21145 A | | 1/2010 | |
| JP | 2012-87302 A | | 5/2012 | |
| JP | 2012-136696 A | | 7/2012 | |
| JP | 2012136696 A | * | 7/2012 | .......... C09J 133/066 |
| JP | 2012136696 A | * | 7/2012 | .......... C09J 133/066 |
| JP | 2012-180520 A | | 9/2012 | |
| JP | 2013-511813 A | | 4/2013 | |
| JP | 2013-166846 A | | 8/2013 | |

OTHER PUBLICATIONS

Ciba IRGACURE 651 Data Sheet.*
JP 2012136696 A Machine Translation.*
JP 2004263030 A Machine Translation.*
Notification of Reasons for Refusal dated Oct. 25, 2016 from the Japanese Patent Office in counterpart Japanese application No. 2014-226174.
Notification of Reasons for Refusal dated Aug. 9, 2016 from the Japanese Patent Office in counterpart application No. 2014-226174.

* cited by examiner

ELECTRO-CONDUCTIVE PRESSURE-SENSITIVE ADHESIVE TAPE, AN ELECTRONIC MEMBER, AND A PRESSURE-SENSITIVE ADHESIVE

CROSS-REFERENCE TO RELATED APPLICATION

This application claims priority from Japanese Patent Applications No. 2013-245230 filed on Nov. 27, 2013 and No. 2014-226174 filed on Nov. 6, 2014. The entire contents of the priority application are incorporated herein by reference.

TECHNICAL FIELD

The present invention described in this specification relates to an electro-conductive pressure-sensitive adhesive tape, an electronic member, and a pressure-sensitive adhesive.

BACKGROUND

Electro-conductive pressure-sensitive adhesive tapes comprising a pressure-sensitive adhesive layer containing an electro-conductive particle such as a metal powder have been already known. This kind of electro-conductive pressure-sensitive adhesive tapes have been widely used for electromagnetic shielding from electrical/electronic appliances and cables, for electrical conduction between two points separated from each other (e.g., between an electrode and a wiring terminal), and for establishing a ground for static protection, and so on (see Patent Documents 1 to 5, for example).

Patent Document 1: Japanese Unexamined Patent Application Publication No. 2005-54157; Patent Document 2: Japanese Unexamined Patent Application Publication No. 2009-79127; Patent Document 3: Japanese Unexamined Patent Application Publication No. 2010-21145; Patent Document 4: Japanese Unexamined Patent Application Publication No. 2007-211122; Patent Document 5: Japanese Translation of PCT International Application Publication No. 2008-525579.

In recent years, sliming of electro-conductive pressure-adhesive tapes and reduction of their adhesive areas for use in electrical/electronic appliances have been recently demanded, since the electrical/electronic appliances have become more and more downsized and slimmed. However, in a narrow electro-conductive pressure-adhesive tape with a small adhesive area, a decrease in the content of the electro-conductive particles in the pressure-sensitive adhesive layer for the purpose of securing the sufficient pressure-sensitive adhesive force to an adherend may cause a decrease in the conductivity. On the other hand, an increase in the content of the electro-conductive particles in the pressure-sensitive adhesive layer for the purpose of securing the conductivity may cause a decrease in the pressure-sensitive adhesive force of electro-conductive pressure-sensitive adhesive tapes or, in the first place, may cause an incapability of forming a pressure-sensitive adhesive tape.

SUMMARY

An electro-conductive pressure-sensitive adhesive tape comprises a pressure-sensitive adhesive layer containing a resin component and an electro-conductive particle. The electro-conductive particle has at least one peak top existing in a particle size range from about 15 µm or more to about 50 µm or less, and at least one further peak top existing in a particle size range from about 1 µm or more to about 12 µm or less in a particle size distribution curve thereof. The electro-conductive particle is contained in the pressure-sensitive adhesive layer in an amount of 40 mass % or more but 80 mass % or less, and has a true density in a level of larger than zero but smaller than 8 g/cm$^3$.

DETAILED DESCRIPTION

Objects of technologies described herein include, but not limited to, solving the problems of known electro-conductive pressure-sensitive adhesive tapes. The technologies described herein provide an electro-conductive pressure-sensitive adhesive tape capable of securing sufficient conductivity and sufficient pressure-sensitive adhesive force even with a small adhesive area to an adherend.

After intensive investigations to achieve the above-mentioned object, the present inventors have found that an electro-conductive pressure-sensitive adhesive tape of the following features can secure sufficient conductivity and sufficient pressure-sensitive adhesive force even with a small adhesive area to an adherend, and complete the present invention. Namely, the electro-conductive pressure-sensitive adhesive tape comprises a pressure-sensitive adhesive layer containing a resin component and an electro-conductive particle, wherein the electro-conductive particle has at least one peak top existing in a particle size range from about 15 µm or more to about 50 µm or less and at least one further peak top existing in a particle size range from about 1 µm or more to about 12 µm or less in a particle size distribution curve thereof, the electro-conductive particle is contained in the pressure-sensitive adhesive layer in an amount of 40 mass % or more but 80 mass % or less, and the electro-conductive particle has a true density in a level of larger than zero but smaller than 8 g/cm$^3$.

The electro-conductive pressure-sensitive adhesive tape of this embodiment comprises a pressure-sensitive adhesive layer containing electro-conductive particles having a specific particle size distribution dispersed therein.

An electro-conductive pressure-sensitive adhesive tape may be called by different terms such as an electro-conductive pressure-sensitive adhesive sheet and an electro-conductive pressure-sensitive adhesive film. In this specification, the term "electro-conductive pressure-sensitive adhesive tape" will be used throughout the text. A surface of the pressure-sensitive adhesive layer of the electro-conductive pressure-sensitive adhesive tape may be referred to as a pressure-sensitive adhesive surface.

The electro-conductive pressure-sensitive adhesive tape of this embodiment may be either double-sided adhesive type having pressure-sensitive adhesive surfaces on both surfaces thereof, or single-sided adhesive type having a pressure-sensitive adhesive surface on only one surface thereof.

The double-sided electro-conductive pressure-sensitive tape may be either a substrate-less double-sided electro-conductive pressure-sensitive adhesive tape that does not comprise an electro-conductive substrate, or a double-sided electro-conductive pressure-sensitive adhesive tape that comprises an electro-conductive substrate such as a metallic foil.

Figure 1:
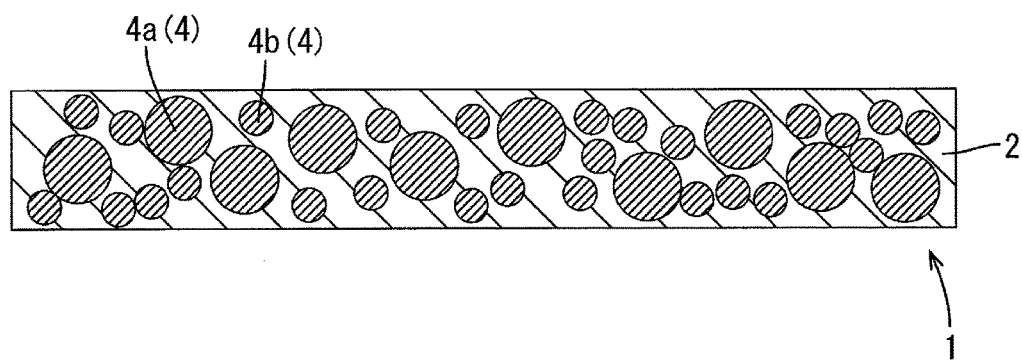
FIG. 1 is a typical view of an electro-conductive pressure-sensitive adhesive tape comprising a pressure-sensitive adhesive layer without a base member.

Examples of the substrate-less double-sided electro-conductive pressure-sensitive adhesive tape include an electro-conductive pressure-sensitive adhesive tape shown in FIG. 1 comprising a pressure-sensitive adhesive layer 2 without a base member. Examples of the double-sided electro-conductive pressure-sensitive adhesive tape with substrate include an electro-conductive pressure-sensitive adhesive tape shown in FIG. 2 comprising pressure-sensitive adhesive layers 2 formed on both surfaces of the substrate 3.

Figure 2:
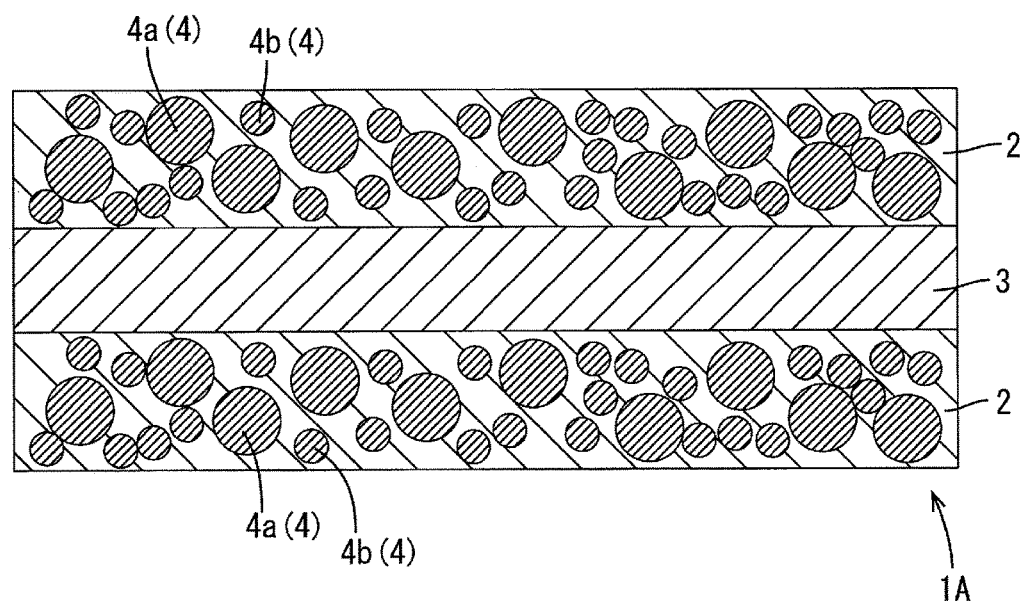
FIG. 2 is a typical view of an electro-conductive pressure-sensitive adhesive tape comprising an electro-conductive substrate and pressure-sensitive adhesive layers formed on both surfaces of the electro-conductive substrate.
Figure 3:
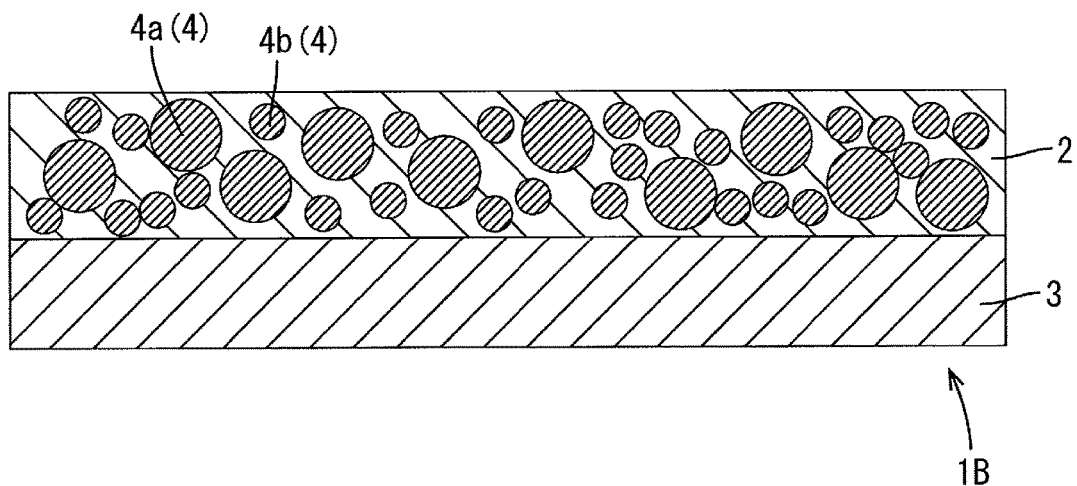
FIG. 3 is a typical view of an electro-conductive pressure-sensitive adhesive tape comprising an electro-conductive substrate and a pressure-sensitive adhesive layer formed on one surface of the electro-conductive substrate.
Figure 4:
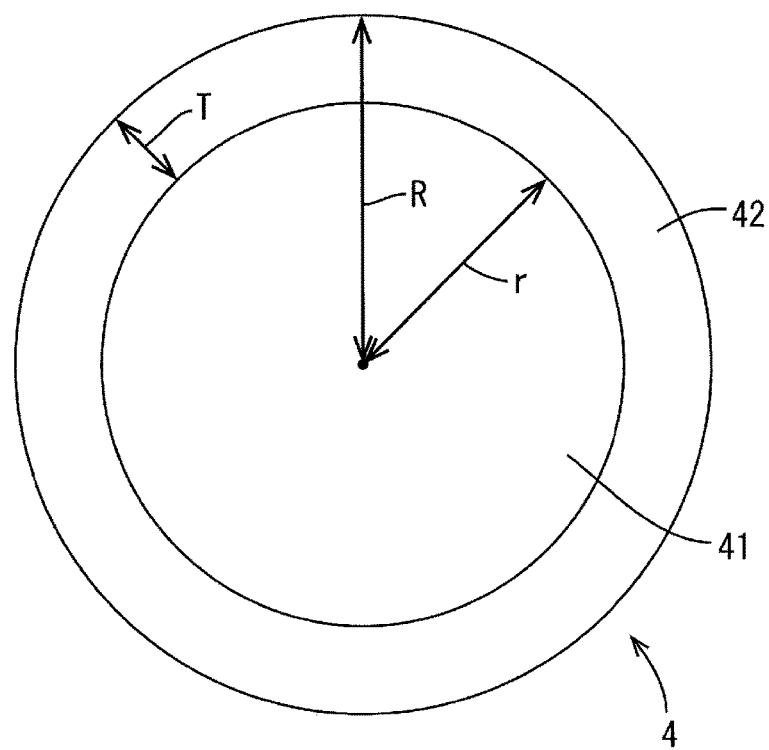
FIG. 4 is an explanatory drawing schematically illustrating a cross-sectional SEM image used for calculating true density of the electro-conductive particles.

Examples of the single-sided electro-conductive pressure-sensitive adhesive tape include an electro-conductive pressure-sensitive adhesive tape 1B shown in FIG. 3 comprising a pressure-sensitive adhesive layer 2 formed on one surface of an electro-conductive substrate 3 such as metallic foils. FIGS. 1 to 3 schematically show electro-conductive particles 4 (4a, 4b) contained in a pressure-sensitive layer 2.

The electro-conductive pressure-sensitive adhesive tape of this embodiment may include layers (e.g., an intermediate layer and an undercoat layer) other than an electro-conductive substrate and an electro-conductive pressure-sensitive adhesive layer as long as an intended effect of the present invention can be achieved.

[Pressure-Sensitive Adhesive Layer]

The pressure-sensitive adhesive layer is an electro-conductive (electrically conductive) layer that provides pressure-sensitive adhesive surfaces of the electro-conductive pressure-sensitive adhesive tape. If the pressure-sensitive adhesive surface is attached to an adherend such as an electrical conductor, electrical conduction is secured between the pressure-sensitive adhesive layer and the adherend.

The pressure-sensitive adhesive layer contains a resin component and an electro-conductive particle. The pressure-sensitive adhesive layer may contain other components (additives) as long as an intended effect of the present invention can be achieved.

(Resin Component)

The resin component secures pressure-sensitive adhesive force of the pressure-sensitive adhesive layer. The resin component used in the pressure-sensitive adhesive layer is not limited to a specific resin. The resin component preferably contains an acrylic polymer from the viewpoints such as polymer design efficiency, pressure-sensitive adhesive force control efficiency, and securing dispersibility of electro-conductive particles therein.

A content (lower limit value) of the resin component over a total mass of the pressure-sensitive adhesive layer (100 mass %) is preferably 20 mass % or more, more preferably 25 mass % or more, and further more preferably 30 mass % or more. A content (upper limit value) of the resin component over a total mass of the pressure-sensitive adhesive layer (100 mass %) is preferably 60 mass % or less, and more preferably 55 mass % or less.

A content (lower limit value) of the acrylic polymer over a total mass of the resin component (100 mass %) is preferably 50 mass % or more, and more preferably 60 mass % or more. A content (upper limit value) of the acrylic polymer over a total mass of the resin component (100 mass %) is preferably 100 mass % or less, and more preferably 90 mass % or less.

Acrylic polymer is not limited to a specific polymer. The acrylic polymer is preferably formed by monomer components of a (meth)acrylic acid alkyl ester including any one of a linear- or branched-chain alkyl group with a carbon number of 1 to 20 (hereinafter referred to as (meth)acrylic acid alkyl ester), and a polar group-containing monomer, for example. In this specification, the term "(meth)acrylic" means acrylic and/or methacrylic (i.e., any one of or both of acrylic and methacrylic).

Examples of the (meth)acrylic acid alkyl ester include (meth)acrylic acid methyl, (meth)acrylic acid ethyl, (meth)acrylic acid propyl, (meth)acrylic acid isopropyl, (meth)acrylic acid n-butyl, (meth)acrylic acid isobutyl, (meth)acrylic acid s-butyl, (meth)acrylic acid t-butyl, (meth)acrylic acid pentyl, (meth)acrylic acid isopentyl, (meth)acrylic acid hexyl, (meth)acrylic acid heptyl, (meth)acrylic acid octyl, (meth)acrylic acid 2-ethylhexyl, (meth)acrylic acid isooctyl, (meth)acrylic acid nonyl, (meth)acrylic acid isononyl, (meth)acrylic acid decyl, (meth)acrylic acid isodecyl, (meth)acrylic acid undecyl, (meth)acrylic acid dodecyl, (meth)acrylic acid tridecyl, (meth)acrylic acid tetradecyl, (meth)acrylic acid pentadecyl, (meth)acrylic acid hexadecyl, (meth)acrylic acid heptadecyl, (meth)acrylic acid octadecyl, (meth)acrylic acid nonadecyl, and (meth)acrylic acid eicosyl. The (meth)acrylic acid alkyl ester compounds may be used alone or in a combination of two or more kinds.

A (meth)acrylic acid alkyl ester including an alkyl group with a carbon number of 4 to 12 is preferred for the (meth)acrylic acid alkyl ester, and a (meth)acrylic acid alkyl ester including an alkyl group with a carbon number of 4 to 8 is more preferred.

A content (lower limit value) of the (meth)acrylic acid alkyl ester over a total mass of all monomer components comprising the acrylic polymer (100 mass %) is preferably 50 mass % or more, more preferably 55 mass % or more, and further more preferably 60 mass % or more. A content (upper limit value) of the (meth)acrylic acid alkyl ester over a total mass of all monomer components comprising the acrylic polymer (100 mass %) is preferably 99 mass % or less, more preferably 98 mass % or less, and further more preferably 97 mass % or less.

The polar group-containing monomer comprises a monomer containing at least one polar group and a polymerizable unsaturated bond. Examples of the polar group-containing monomer include: carboxyl group-containing monomers such as (meth)acrylic acid, itaconic acid, maleic acid, fumaric acid, crotonic acid, isocrotonic acid, and anhydrides of these acids (acid anhydride group-containing monomers, e.g., maleic anhydride and itaconic anhydride); hydroxyl group-containing monomers such as (meth)acrylic acid 2-hydroxyethyl, (meth)acrylic acid 3-hydroxypropyl, (meth) acrylic acid 4-hydroxybutyl, (meth)acrylic acid 6-hydroxyhexyl, vinyl alcohol, and allyl alcohol; amide group-containing monomers such as (meth)acrylamide, N,N-dimethyl (meth)acrylamide, N-methylol(meth)acrylamide, N-methoxymethyl(meth)acrylamide, N-butoxymethyl (meth)acrylamide, and N-hydroxyethyl(meth)acrylamide; amino group-containing monomers such as (meth)acrylic acid aminoethyl, (meth)acrylic acid dimethylaminoethyl, and (meth)acrylic acid t-butylaminoethyl; epoxy group-containing monomers such as (meth)acrylic acid glycidyl, and (meth)acrylic acid methylglycidyl; cyano group-containing monomers such as acrylonitrile, and methacrylonitrile; heterocycle-containing vinyl monomers such as N-vinyl-2-pyrrolidone, (meth)acryloyl morpholine, N-vinylpiperidone, N-vinylpiperazine, N-vinylpyrrole, and N-vinylimidazole; alkoxyalkyl (meth)acrylate monomers such as methoxyethyl (meth)acrylate, ethoxyethyl (meth) acrylate; sulfonate group-containing monomers such as vinyl sulfonate sodium; phosphate group-containing monomers such as 2-hydroxyethyl acryloyl phosphate; imide group-containing monomers such as cyclohexyl maleimide and isopropylmaleimide; and isocyanate group-containing monomers such as 2-methacryloyloxyethyl isocyanate. The polar group-containing monomers may be used alone or in a combination of two or more kinds.

Carboxyl group-containing monomers and hydroxyl group-containing monomers are preferred for the polar group-containing monomer. Carboxyl group-containing monomers are more preferred, and Acrylic acid (AA) is further preferred.

A content (lower limit value) of the polar group-containing monomer over a total mass of all monomer components comprising the acrylic polymer (100 mass %) is preferably 0.1 mass % or more, and more preferably 1 mass % or more. A content (upper limit value) of the polar group-containing monomer over a total mass of all monomer components comprising the acrylic polymer (100 mass %) is preferably 20 mass % or less, and more preferably 10 mass % or less.

The acrylic polymer may contain copolymerizable monomers such as polyfunctional monomers as a monomer component (constituent) other than the (meth)acrylic acid alkyl ester and the polar group-containing monomer, as necessary.

The polyfunctional monomer comprises a monomer containing at least two polymerizable functional groups. Examples of the polyfunctional monomers include hexanediol di(meth)acrylate, butanediol di(meth)acrylate, (poly) ethylene glycol di(meth)acrylate, (poly)propylene glycol di(meth)acrylate, neopentyl glycol di(meth)acrylate, pentaerythritol di(meth)acrylate, pentaerythritol tri(meth)acrylate, dipentaerythritol hexa(meth)acrylate, trimethylolpropane tri(meth)acrylate, tetramethylol methane tri(meth) acrylate, allyl(meth)acrylate, vinyl(meth)acrylate, divinylbenzene, epoxy acrylate, polyester acrylate, and urethane acrylate. The polyfunctional monomers may be used alone or in a combination of two or more kinds.

A content (lower limit value) of the polyfunctional monomer over a total mass of all monomer components comprising the acrylic polymer (100 mass %) is preferably 0.001 mass % or more, and more preferably 0.01 mass % or more. A content (upper limit value) of the polyfunctional monomer over a total mass of monomer components comprising the acrylic polymer (100 mass %) is preferably 0.5 mass % or less, and more preferably 0.3 mass % or less. If the content of the polyfunctional monomer falls within the above specified range, cohesion in the pressure-sensitive adhesive layer is prevented from becoming too high and pressure-sensitive adhesive force can be improved.

Copolymerizable monomer other than polyfunctional monomers is not limited to a specific monomer. Examples of the copolymerizable monomer include: (meth)acrylic acid alkoxyalkyl esters such as 2-methoxyethyl (meth)acrylate, 2-ethoxyethyl (meth)acrylate, methoxy triethylene glycol (meth)acrylate, 3-methoxybutyl (meth)acrylate, 3-ethoxypropyl (meth)acrylate, 4-methoxybutyl (meth)acrylate, 4-ethoxybutyl (meth)acrylate; (meth)acrylic acid esters having an alicyclic hydrocarbon group such as cyclopentyl (meth)acrylate, cyclohexyl (meth)acrylate, isobornyl (meth) acrylate; (meth)acrylic acid aryl esters such as phenyl (meth) acrylate; vinyl esters such as vinyl acetate and vinyl propionate; aromatic vinyl compounds such as styrene and vinyl toluene; olefins or dienes such as ethylene, butadiene, isoprene, and isobutylene; vinyl ethers such as vinyl alkyl ether; and vinyl chloride. The copolymerizable monomers may be used alone or in a combination of two or more kinds.

The acrylic polymer can be prepared by a publicly known or commonly used polymerization method. Examples of such a method include solution polymerization, emulsion polymerization, mass polymerization, and photopolymerization. Upon preparation of the acrylic polymer, it is preferable to utilize a curing reaction caused by heat or active energy rays (e.g., ultraviolet rays) with a polymerization initiator such as a thermal polymerization initiator or a photopolymerization initiator from the viewpoints such as dispersibility of the electro-conductive particles. Especially, because of the short polymerization period, it is preferable to use a curing reaction with a photopolymerization initiator.

The acrylic polymer can be prepared by polymerizing a monomer composition containing a photopolymerization initiator with an active energy rays (e.g., ultraviolet rays) applied thereto. In the preparation of the acrylic polymer, other components to be included in the pressure-sensitive adhesive layer may be added in addition to the polymerization initiator. A method of preparing the acrylic polymer using a solventless-type pressure-sensitive adhesive composition including monomer components will be described in detail in the following section (Method of Forming Pressure-sensitive adhesive layer).

The polymerization initiator such as a thermal polymerization initiator or a photopolymerization initiator used for preparation of the acrylic polymer compounds may be used alone or in a combination of two or more kinds.

Examples of the thermal polymerization initiator include: azo polymerization initiators such as 2,2'-azobisisobutyronitrile, 2,2'-azobis-2-methylbutyronitrile, 2,2'-azobis(2-methylpropionic acid)dimethyl, 4,4'-azobis-4-cyanovalerianic acid), azobis isovaleronitrile, 2,2'-azobis(2-amidinopropane)dihydrochloride, 2,2'-azobis[2-(5-methyl-2-imidazoline-2-yl)propane]dihydrochloride, 2,2'-azobis(2-methylpropionamidine)disulfate, and 2,2'-azobis (N,N'-dimethyleneisobutylamidine)dihydrochloride; peroxide polymerization initiators such as dibenzoyl peroxide, t-butyl permaleate, and lauroyl peroxide; and redox polymerization initiators. The amount of the thermal polymerization initiator is not limited to a specific amount and may be any amount within a normal range in which the thermal polymerization initiator can be normally used.

Examples of the photopolymerization initiator include benzoin ether photopolymerization initiators, acetophenone photopolymerization initiators, α-ketol photopolymerization initiators, aromatic sulfonyl chloride photopolymerization initiators, photoactive oxime photopolymerization initiators, benzoin photopolymerization initiators, benzyl photopolymerization initiators, benzophenone photopolymerization initiators, ketal photopolymerization initiators, thioxanthone photopolymerization initiators, and acylphosphine oxide photo-polymerization initiators.

Examples of the benzoin ether photopolymerization initiators include benzoin methyl ether, benzoin ethyl ether, benzoin propyl ether, benzoin isopropyl ether, benzoin isobutyl ether, 2,2-dimethoxy-1,2-diphenylethane-1-one (IRGACURE 651 manufactured by BASF), and anisole methyl ether. Examples of the acetophenone photopolymerization initiators include 1-hydroxycyclohexyl phenyl ketone (IRGACURE 184 manufactured by BASF), 4-phenoxy dichloroacetophenone, 4-t-butyl-dichloroacetophenone, 1-[4-(2-hydroxyethoxy)-phenyl]-2-hydroxy-2-methyl-1-propane-1-one (IRGACURE 2959 manufactured by BASF), 2-hydroxy-2-methyl-1-phenyl-propane-1-one (DAROCUR 1173 manufactured by BASF), and methoxy acetophenone. Examples of the α-ketol photopolymerization initiators include 2-methyl-2-hydroxy propiophenone, and 1-[4-(2-hydroxyethyl)-phenyl]-2-hydroxy-2-methylpropane-1-one.

Examples of the aromatic sulfonyl chloride photopolymerization initiators include 2-naphthalene sulfonyl chloride. Examples of the photoactive oxime photopolymerization initiators include 1-phenyl-1,1-propanedione-2-(o-ethoxycarbonyl)-oxime. Examples of the benzoin photopolymerization initiators include benzoin. Examples of the benzyl photopolymerization initiators include benzyl. Examples of the benzophenone photopolymerization initiators include: benzophenone; benzoylbenzoic acid; 3,3'-dimethyl-4-methoxybenzophenone; polyvinyl benzophenone; and α-hydroxy cyclohexyl phenyl ketone. Examples of the ketal photopolymerization initiators include benzyldimethyl ketal. Examples of the thioxanthone photopolymerization initiators include: thioxanthone; 2-chlorothioxanthone; 2-methyl thioxanthone; 2,4-dimethyl thioxanthone; isopropyl thioxanthone; 2,4-dichloro thioxanthone; 2,4-diethyl thioxanthone; isopropyl thioxanthone; 2,4-diisopropyl thioxanthone; and dodecyl thioxanthone.

Examples of the acylphosphine oxide photo-polymerization initiators include: bis(2,6-dimethoxybenzoyl)phenylphosphine oxide; bis(2,6-dimethoxybenzoyl)(2,4,4-trimethylpentyl)phosphine oxide; bis(2,6-dimethoxybenzoyl)-n-butyl phosphine oxide; bis(2,6-dimethoxybenzoyl)-(2-methylpropane-1-yl)phosphine oxide; bis(2,6-dimethoxybenzoyl)-(1-methylpropane-1-yl)phosphine oxide; bis(2,6-dimethoxybenzoyl)-t-butylphosphine oxide; bis(2,6-dimethoxybenzoyl)cyclohexylphosphine oxide; bis (2,6-dimethoxybenzoyl)octylphosphine oxide; bis(2-methoxybenzoyl)(2-methylpropane-1-yl)phosphine oxide; bis(2-methoxybenzoyl)(1-methylpropane-1-yl)phosphine oxide; bis(2,6-diethoxybenzoyl)(2-methylpropane-1-yl) phosphine oxide; bis(2,6-diethoxybenzoyl)(1-methylpropane-1-yl)phosphine oxide; bis(2,6-dibutoxybenzoyl)(2-methylpropane-1-yl)phosphine oxide; bis(2,4-dimethoxybenzoyl)(2-methypropane-1-yl)phosphine oxide; bis(2,4,6-trimethylbenzoyl)(2,4-dipentoxyphenyl)phosphine oxide; bis(2,6-dimethoxybenzoyl)benzyl phosphine oxide; bis(2,6-dimethoxybenzoyl)-2-phenylpropyl phosphine oxide; bis(2,6-dimethoxybenzoyl)-2-phenylethyl phosphine oxide; bis(2,6-dimethoxybenzoyl)benzyl phosphine oxide; bis(2,6-dimethoxybenzoyl)-2-phenylpropyl phosphine oxide; bis(2,6-dimethoxybenzoyl)-2-phenylethyl phosphine oxide; 2,6-dimethoxybenzoyl benzylbutylphosphine oxide; 2,6-dimethoxybenzoyl benzyloctylphosphine oxide; bis(2,4,6-trimethylbenzoyl)-2,5-diisopropylphenylphosphine oxide; bis(2,4,6-trimethylbenzoyl)-2-methylphenylphosphine oxide; bis(2,4,6-trimethylbenzoyl)-4-methylphenylphosphine oxide; bis(2,4,6-trimethylbenzoyl)-2,5-diethylphenylphosphine oxide; bis(2,4,6-trimethylbenzoyl)-2,3,5,6-tetramethylphenylphosphine oxide; bis(2,4,6-trimethyl benzoyl)-2,4-di-n-butoxy phenylphosphine oxide; 2,4,6-trimethylbenzoyl diphenylphosphine oxide; bis(2,6-dimethoxybenzoyl)-2,4,4-trimethylpentylphosphine oxide; bis(2,4,6-trimethylbenzoyl)isobutylphosphine oxide; 2,6-dimethoxybenzoyl-2,4,6-trimethylbenzoyl-n-butylphosphine oxide; bis(2,4,6-trimethylbenzoyl)phenylphosphine oxide; bis(2,4,6-trimethylbenzoyl)-2,4-dibutoxyphenylphosphine oxide; 1,10-bis[bis(2,4,6-trimethylbenzoyl)phosphine oxide]decane; and tri(2-methylbenzoyl)phosphine oxide.

The amount of photopolymerization initiator is not limited to a specific amount as long as the acrylic polymer can be formed by the photopolymerization reaction. For example, a lower limit value of parts by mass of photopolymerization initiator over 100 parts by mass of all monomer components used for forming the acrylic polymer is preferably 0.01 parts by mass or more, more preferably 0.03 parts by mass or more, and further more preferably 0.05 parts by mass or more. An upper limit value of parts by mass of photopolymerization initiator is preferably 5 parts by mass or less, more preferably 3 parts by mass or less, and further more preferably 2 parts by mass or less. If the amount of photopolymerization initiator falls within the above specified range, a sufficient level of polymerization reaction can be performed and thus the molecular weight of polymer is less likely to decrease when the polymer is formed.

During the activation of the photopolymerization initiator, the active energy rays are used. Examples of such active energy rays include ionization radiations such as alpha rays, beta rays, gamma rays, neutron rays, and electron rays; and ultraviolet rays. Especially, the ultraviolet rays are preferred. An amount, time, and a method of irradiation of the active energy rays are not limited to specific amount, time, and method as long as a reaction of monomer component occurs by activating the photopolymerization initiator.

(Electro-Conductive Particle)

As for the electro-conductive particle (electro-conductive filler), an electro-conductive particle having at least one peak top in a particle size range from about 15 μm or more to about 50 μm or less and at least one further peak top in a particle size range from about 1 μm or more to about 12 μm or less in a particle size distribution curve (frequency distribution curve) thereof is used.

A particle having conductivity such as a metal powder is used for the electro-conductive particle. Examples of the material used for the electro-conductive particle include: metals such as nickel, iron, chromium, cobalt, aluminum, antimony, molybdenum, copper, silver, platinum, and gold; alloys or oxides of these materials such as solder and stainless steel; carbon such as carbon black. The electro-conductive particle may be a particle (powder) made of above-mentioned electro-conductive materials, or may be a particle such as a polymer bead or a glass bead coated with metal on its surface (a metal-coated particle). Alternatively, a metal particle coated with other metal on its surface may be used for the electro-conductive particle.

The electro-conductive particles may be in various shapes including spherical, flake-like (squamous), spike-like (close-cropped shape), or filament-like, and can be properly selected from publicly known ones. The electro-conductive particles are preferably spherical in shape from the viewpoints such as securing pressure-sensitive adhesive force and efficiency of forming electro-conductive paths in the pressure-sensitive adhesive layer. Herein after, an electro-conductive particle in almost spherical shape as a whole may be especially referred to as "a roughly spherical electro-conductive particle".

<True Density>

An electro-conductive particle having true density in a level of larger than zero but smaller than 8 g/cm³ can be used for the electro-conductive particle. If the electro-conductive particle is constituted only with an electro-conductive material, true density of the electro-conductive particle is equal to specific gravity of the electro-conductive material. Meanwhile, if the electro-conductive particle is constituted with a non-conductive particle and a coating layer formed thereon such as the above-mentioned metal-coated particles for example, i.e., if the electro-conductive particle is constituted with a plurality of materials with different specific gravity, true density of the electro-conductive particle is determined according to the following method. When it is impossible to determine true density of the electro-conductive particle by the following method, it may be properly determined using any conventionally known method.

In the following, an electro-conductive particle 4 containing a spherical glass bead (glass layer) 41 coated with silver (silver coating layer) 42 on its surface will be described as an example for the electro-conductive particle. Image of the electro-conductive particle 4 is photographed by using Scanning Electron Microscope (SEM), and radius R of the electro-conductive particle 4, thickness T of the silver coating layer 42, radius r of the glass layer 41 in the obtained image (cross-sectional SEM image) are measured. Then, true density of the electro-conductive particle 4 is calculated with using the measured values. The calculation method will be described in more detail in the following.

<<Image Photographing of the Electro-Conductive Particle by Using SEM>>

Sample of the electro-conductive particle 4 is treated prior to image photographing by using SEM. Specifically, the electro-conductive particle 4 is dyed with a heavy metal (heavy metal dyeing) before ion milling processed and then subjected to conductive treatment. SEM observation (image photographing) is performed on the sample of the electro-conductive particle 4 prepared as mentioned above. The SEM image photograph shows cross-sectional view of the electro-conductive particle 4.

As the analyzing apparatus (SEM), S-4800 manufactured by Hitachi can be used. Measuring conditions for the analyzing apparatus (SEM) are: observation image: reflective electron image, accelerating voltage: 10 kV.

<<Calculation of True Density of the Electro-Conductive Particle by Using the Measured Values>>

Thickness T of the silver coating layer 42 can be measured on the photographed cross-sectional SEM image of the electro-conductive particle 4. Then, by using the obtained thickness T (measured value) of the silver coating layer 42, volume v2 of the silver coating layer 42 per one electro-conductive particle 4 and mass m2 of the silver coating layer 42 per one electro-conductive particle 4 can be calculated. The calculation may be carried out by using specific gravity of silver (the typical value in the literature: 10 g/cm³).

Radius r of the glass layer 41 can be measured on the photographed cross-sectional SEM image of the electro-conductive particle 4. Then, by using the obtained radius r (measured value) of the glass layer 41, volume v1 of the glass layer 41 per one electro-conductive particle 4, mass m1 of the glass layer 41 per one electro-conductive particle 4 can be calculated. The calculation may be carried out by using specific gravity of glass (the typical value in the literature: 2.5 g/cm³).

Radius r of the glass layer 41 may be calculated from the measured radius R of the electro-conductive particle 4 and the measured thickness T of the silver coating layer 42.

By using the calculated values v1, v2, m1, m2, true density of the electro-conductive particle 4 can be calculated according to the following equation.

$$\text{True density} = (m1+m2)/(v1+v2)$$

Above-mentioned calculation method can be used to determine true density for hollow electro-conductive particles (e.g., electro-conductive particles containing a hollow glass layer 41).

<Particle Size Distribution Curve of the Electro-Conductive Particle>

A particle size distribution curve of the electro-conductive particle can be obtained through image analysis by using computer as described later. The image analysis described later can be used to obtain particle size distribution curves not only for spherical electro-conductive particles but also for electro-conductive particles in other shapes.

The electro-conductive particle of this embodiment may be any electro-conductive particle as long as it has at least one peak top in a particle size range from about 15 μm or more to about 50 μm or less and at least one further peak top in a particle size range from about 1 μm or more to about 12 μm or less in a particle size distribution curve thereof.

Figure 5:
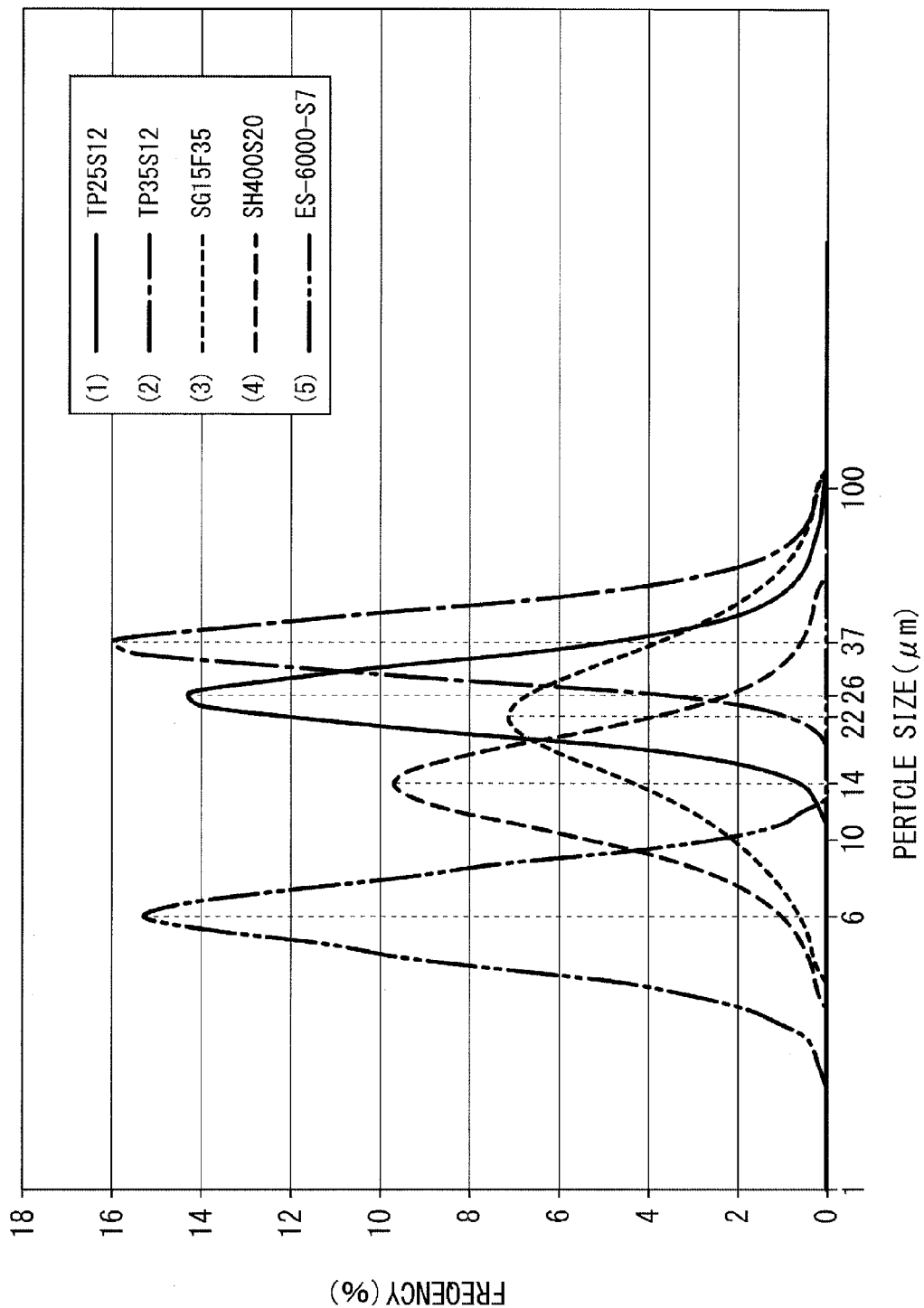
FIG. 5 shows particle size distribution curves of electro-conductive particles.

FIG. 5 shows particle size distribution curves of the electro-conductive particles. In FIG. 5, particle size distribution curves of five electro-conductive particles are shown for reference. The electro-conductive particles used to obtain the particle distribution curves and the particle sizes at peak tops (maximal particle size, μm) are shown below.

(1) TP25S12, manufactured by Potters-Ballotini Co., Ltd., shape: spherical, particle size at peak top: 26 μm.
(2) TP35S12, manufactured by Potters-Ballotini Co., Ltd., shape: spherical, particle size at peak top: 37 μm.
(3) SG15F35, manufactured by Potters-Ballotini Co., Ltd., shape: spherical, particle size at peak top: 22 μm.
(4) SH400S20, manufactured by Potters-Ballotini Co., Ltd., shape: spherical, particle size at peak top: 14 μm.
(5) ES-6000-S7, manufactured by Potters-Ballotini Co., Ltd., shape: spherical, particle size at peak top: 6 μm.

A content (upper limit value) of the electro-conductive particle over total mass of the pressure-sensitive adhesive layer (100 mass %) is 80 mass % or less. A content (upper limit value) of the electro-conductive particle is preferably 75 mass % or less, and more preferably 70 mass % or less. A content (lower limit value) of the electro-conductive particle over total mass of the pressure-sensitive adhesive layer (100 mass %) is preferably 40 mass % or more, and more preferably 45 mass % or more. If the content of the electro-conductive particle falls within the above specified range, conductivity of the pressure-sensitive adhesive layer can be secured while maintaining pressure-sensitive adhesive force of the pressure sensitive adhesive layer.

Hereinafter in this specification, electro-conductive particles consisting predominantly of particles with a particle size in a range from about 15 μm or more to about 50 μm or less are referred to as "a large electro-conductive particles", and electro-conductive particles consisting predominantly of particles with a particle size in a range from about 1 μm or more to about 12 μm or less are referred to as "small electro-conductive particles".

Lower limit value of a ratio (X1/X2) of a content (X1) of large electro-conductive particles to a content (X2) of small electro-conductive particle is preferably 1.1 or more, and more preferably 1.2 or more. Upper limit value of the above-described ratio (X1/X2) is preferably 8.0 or less, and more preferably 7.5 or less.

The electro-conductive particles are substantially uniformly dispersed in the pressure-sensitive adhesive layer. It enables to secure sufficient pressure-sensitive adhesive force and sufficient conductivity of the pressure-sensitive adhesive layer of this embodiment as described later.

The pressure-sensitive adhesive layer may contain adhesive compositions such as rubber-based adhesives, vinyl alkyl ether-based adhesives, silicone-based adhesives, polyester-based adhesives, polyamide-based adhesives, urethane-based adhesives, fluorine-based adhesives, epoxy-based adhesives, as long as an intended effect of the present invention can be achieved. The adhesives may be used alone or in a combination of two or more kinds.

The pressure-sensitive adhesive layer may contain any kind of tackifying resin such as hydrogenated tackifying resin as the resin component, as long as an intended effect of the present invention can be achieved. Examples of the hydrogenated tackifying resin include derivatives prepared by hydrogenating tackifying resins such as petroleum resins, terpene resins, coumarone-indene resins, styrene resins, rosin resins, alkyl phenol resins, and xylene resins. The hydrogenated petroleum resin may be selected from an aromatic system, a dicyclopentadiene system, an aliphatic system, and copolymers of aromatic system and dicyclopentadiene system. The hydrogenated terpene resin may be properly selected from a terpene phenol resin and an aromatic terpene resin. The tackfying resins may be used alone or in a combination of two or more kinds.

The pressure-sensitive adhesive layer may contain a cross-linking agent as a resin component as long as an intended effect of the present invention can be achieved. The cross-linking agent may be used for adjusting the cohesion force of the pressure-sensitive adhesive layer. Examples of the cross-linking agent include epoxy cross-linking agent, isocyanate cross-linking agent, silicone cross-linking agent, oxazoline cross-linking agent, aziridine cross-linking agent, silane cross-linking agent, alkyl-etherified melamine cross-linking agent, and metal chelate cross-linking agent. The cross-linking agent may be used alone or in a combination of two or more kinds.

The pressure-sensitive adhesive layer may include the following components as long as an intended effect of the present invention can be achieved: cross-linking promoter; silane coupling agent; antioxidant; colorant (pigment, dye); ultraviolet absorbing agent; antioxidant; chain transfer agent; plasticizing agent; softener; antistatic agent; solvent; conductive fiber; and oligomer having a weight-average molecular weight (Mw) of 1,000 to 10,000. These components may be used alone or in a combination of two or more kinds.

(Method of Forming Pressure-Sensitive Adhesive Layer)

The pressure-sensitive adhesive layer of this embodiment used for the electro-conductive pressure-sensitive adhesive tape may be formed using pressure-sensitive adhesive composition. The composition is not limited to any particular one and may be properly selected in accordance with a purpose, as long as the pressure-sensitive adhesive layer described above can be formed. The composition may be selected as appropriate for an intended purpose. In terms of workability, the following composition may be preferably used: monomer composition consisting of monomer components used for forming the acrylic polymer, polymerization initiator for polymerizing the monomer composition, electro-conductive particle, curable pressure-sensitive adhesive composition containing a mixture with the other component added as necessary. A light curable pressure-sensitive adhesive composition, which includes a photopolymerization initiator as a polymerization initiator may be preferred. The curable pressure-sensitive adhesive composition is a so-called solventless-type pressure-sensitive adhesive composition prepared by mixing the polymerization initiator into the monomer composition.

The monomer composition usually consists of a mixture of monomer components such as (meth)acrylic acid alkyl ester and polar group-containing monomer. The monomer composition is usually in a liquid state although the monomer composition may be in a different state depending on the kind or the composition ratio. To increase the viscosity of the monomer composition and workability (easiness in handling), a partial polymer may be formed by partially polymerizing monomer components in the monomer composition. The monomer composition including the partial polymer may be in a syrupy state. Unreacted monomer components are properly polymerized after the curable pressure-sensitive adhesive composition is prepared. The electro-conductive particle is preferably added to the monomer composition containing the partial polymer. Any monomer component used for forming the acrylic polymer may further be added to the monomer composition containing the partial polymer in order to adjust viscosity.

For polymerization to form the partial polymer, a publicly known or commonly used polymerization method can be used. The monomer component in the monomer composition may be properly polymerized using various polymerization initiators (e.g., photopolymerization initiator) provided as examples above. The polymerization rate of the partial polymer may be adjusted in a range from 5 mass % to 15 mass %, preferably, from 7 mass % to 10 mass %. The polymerization rate of the partial polymer may be properly adjusted by determining a correlation between the viscosity of the monomer composition and the polymerization rate of the partial polymer in advance and by adjusting the viscosity of the monomer composition based on the correlation. The partial polymer is included into the pressure-sensitive adhesive layer as a part of the acrylic polymer at the end.

If a polyfunctional monomer is used for forming the acrylic polymer as a monomer component, the polyfunctional monomer may be mixed into the monomer composition before the partial polymer is formed. Alternatively, the polyfunctional monomer may be mixed into the monomer composition after the partial polymer is formed. In terms of forming the cross-linking acrylic polymer and adequately increasing the cohesive property of the pressure-sensitive adhesive layer, it is preferable that the polyfunctional monomer is mixed into the monomer composition after the partial polymer is formed.

The prepared curable pressure-sensitive adhesive composition is applied to a base member such as a substrate and a release liner and layered. Then, a curing process is performed on the layered pressure-sensitive adhesive composition. A drying process may be performed before and/or after the curing process as necessary. If the pressure-sensitive adhesive composition includes a thermal polymerization initiator, polymerization starts by heating and the pressure-sensitive adhesive composition is cured. If the pressure-sensitive adhesive composition includes a photo-polymerization initiator, polymerization starts by application of active energy rays such as ultraviolet rays and the pressure-sensitive adhesive composition is cured (photo-curing). The active energy rays may be applied from one side of the layered pressure-sensitive adhesive composition or from both sides thereof. When the pressure-sensitive adhesive composition is cured, the pressure-sensitive adhesive layer that can be used for the electro-conductive pressure-sensitive adhesive sheet of this embodiment is prepared.

For the curing (photo-curing) by the active energy rays, a publicly known or commonly used method for blocking oxygen may be properly used so that the polymerization is not disturbed by oxygen in the air (For example, an appropriate base member such as a release liner and a substrate may be attached to the top surface of the layered pressure-sensitive adhesive composition, or the photo-curing may be performed in a nitrogen atmosphere).

Application (coating) of the pressure-sensitive adhesive composition can be performed by a publicly known or commonly used coating method. A known coater (e.g., gravure roll coater, reverse roll coater, kiss roll coater, dip roll coater, bar coater, knife coater, spray coater, comma coater, and direct coater) can be used.

The pressure-sensitive adhesive layer may be formed using a pressure-sensitive adhesive composition other than the curable pressure-sensitive adhesive composition described earlier as long as an intended effect of the present invention can be achieved (e.g., solvent-type pressure-sensitive adhesive composition and emulsion-type pressure-sensitive adhesive composition). In order to disperse the electro-conductive particles reliably and uniformly in the pressure-sensitive adhesive layer, the pressure-sensitive adhesive layer preferably be formed by using the curable pressure-sensitive adhesive composition (so-called solventless-type pressure-sensitive adhesive composition).

(Thickness (μm) of the Pressure-Sensitive Adhesive Layer)

Thickness (μm) of the pressure-sensitive adhesive layer is not limited to a specific range. A lower limit value of thickness of the pressure-sensitive adhesive layer is preferably 15 μm or more, and more preferably 20 μm or more. An upper limit value of thickness of the pressure-sensitive adhesive layer is preferably 100 μm or less, and more preferably 80 μm or less.

Thickness of the pressure-sensitive adhesive layer can be measured by using a dial gauge specified in the Japanese Industrial Standards (JIS) B 7503 (Mechanical dial gauges) as described later.

When the electro-conductive pressure sensitive adhesive tape comprises two pressure-sensitive adhesive layers, they may be formed in the same thickness, or in the different thickness.

(Electro-Conductive Substrate)

The electro-conductive substrate may be formed with a thin substrate having conductivity, such as metallic foil. The electro-conductive substrate is not limited to the specific substrate and properly selected in accordance with a purpose, as long as it has(having) a self-supporting property and conductivity. A metallic foil is preferably used as an electro-conductive substrate. Examples of the material for the metallic foil used as the electro-conductive substrate include copper, aluminum, nickel, silver, iron, lead, and alloys of these. Among these, aluminum foil and copper foil are preferred, and copper foil is more preferred from the viewpoints such as conductivity, workability, and cost. A surface of the metallic foil may be subjected to various surface treatments such as tin-plating, silver-plating, and gold-plating. A copper foil subjected to tin-plating (tin-plated copper foil) is preferable from the viewpoints of restraining failure on its appearance and decrease of its conductivity due to corrosion.

The thickness of the electro-conductive substrate is not limited to a specific range, but it (lower limit value) is preferably 5 μm or more, more preferably 8 μm or more, and further more preferably 10 μm or more. 30 mass % or more, for example. The thickness (upper limit value) is preferably 200 μm or less, more preferably 150 μm or less, and further more preferably 100 μm or less. If the thickness of the electro-conductive substrate falls within the above specified range, sufficient strength of the electro-conductive pressure-sensitive adhesive tape is secured, and workability of its processing and adhering is improved.

(Release Liner)

The electro-conductive pressure-sensitive adhesive tape of this embodiment may comprise a release liner to protect an adhesive surface of the pressure-sensitive adhesive layer until usage of the tape. The release liner for use herein is not especially limited to a specific release liner and can be properly selected from any of known release liners.

Examples of the release liner include: substrates having a releasable layer, such as plastic films and papers whose surfaces have been treated with a release agent such as silicone-based release agents, long-chain alky-based release agents, fluorine-based release agents, or molybdenum sulfides; low-adhesive substrates formed by fluorine-containing polymers such as polytetrafluoroethylenes, polychlorotrifluoroethylenes, poly(vinyl fluoride)s, poly(vinylidene fluoride)s, tetrafluoroethylene-hexafluoropropylene copolymers, and chlorofluoroethylene-vinylidene fluoride copolymers; and low-adhesive substrates formed by nonpolar polymers such as olefinic resins (e.g., polyethylenes and polypropylenes).

(Adhesive Force)

The pressure sensitive adhesive layer in the electro-conductive pressure-sensitive adhesive tape of this embodiment has pressure-sensitive adhesive force (N/20 mm) of 3N/20 mm or more. If pressure-sensitive adhesive force (N/20 mm) of the pressure-sensitive adhesive layer falls within the above specified range, the electro-conductive pressure-sensitive adhesive tape (the pressure-sensitive adhesive layer) can be said to have sufficient adhesive force (pressure-sensitive adhesive force) even with a small adhesive area to an adherend.

Upper limit of pressure-sensitive adhesive force of the pressure-sensitive adhesive layer is not especially limited but can be set at 20 (N/20 mm), for example.

Pressure-sensitive adhesive force of the pressure-sensitive adhesive layer can be measured by 180° Degree Peel Adhesion Test based on the Japanese Industrial Standards (JIS) Z 0237 (180° peeling test for adhesive tapes) described later.

(Conductivity)

The pressure-sensitive adhesive layer in the electro-conductive pressure-sensitive adhesive tape of this embodiment has an electric resistance value less than 6Ω, preferably less than 4Ω, in thickness direction with an adhesive area of 5 mm×5 mm. An electric resistance value of the pressure-sensitive adhesive layer can be measured by using "measuring method 3 for electric resistance values" described later. If the electric resistance value of the pressure-sensitive adhesive layer falls within the above specified range, the electro-conductive pressure-sensitive adhesive tape (the pressure-sensitive adhesive layer) can be said to have sufficient conductivity even with a small adhesive area to an adherend.

The electro-conductive pressure-sensitive adhesive tape of this embodiment can be used for a ground of printed wiring board, a ground of armor shielding case in electronic appliances, and a ground for static protection (an earth), for example. The electro-conductive pressure-sensitive adhesive tape can also be used for internal wiring in power supply apparatuses, electronic appliances (e.g., portable information terminal devices, liquid crystal display devices, organic EL (electroluminescence) display devices, PDPs (plasma display panels), display devices such as electronic papers, solar cells). The electro-conductive pressure-sensitive adhesive tape can further be used for electrical conduction between two points separated from each other, and electromagnetic shielding from electrical/electronic appliances and cables.

The electro-conductive pressure-sensitive adhesive tape of this embodiment can secure both of the conductivity and pressure-sensitive adhesive force even with a small adhesive area to an adherend. Accordingly, the electro-conductive pressure-sensitive adhesive tape can be suitably used especially for small electrical/electronic appliances (e.g., portable information terminal devices, smartphones, tablet-type terminal devices, mobile phones, car navigation systems).

Further, the electro-conductive pressure-sensitive adhesive tape can be used in an electronic member. Examples for the electronic member include wiring boards (e.g., FPCs, rigid circuit boards), cameras, CPUs, driving circuits, antennas, reinforcing boards for a wiring board.

Still further, shape of the pressure-sensitive adhesive of this invention is not limited to a specific shape. Though layered pressure-sensitive adhesives (pressure-sensitive adhesive layers) are used in the above-described electro-conductive pressure-sensitive adhesive tapes, the pressure-sensitive adhesive may be in other shape. The pressure-sensitive adhesive layers exemplified in above can be used as the pressure-sensitive adhesive of this invention.

<1> An electro-conductive pressure-sensitive adhesive tape comprises a pressure-sensitive adhesive layer containing a resin component and an electro-conductive particle. The electro-conductive particle has at least one peak top existing in a particle size range from about 15 µm or more to about 50 µm or less, and at least one further peak top existing in a particle size range from about 1 µm or more to about 12 µm or less in a particle size distribution curve thereof. The electro-conductive particle is contained in the pressure-sensitive adhesive layer in an amount of 40 mass % or more but 80 mass % or less, and has a true density in a level of larger than zero but smaller than 8 g/cm³.

<2> In the electro-conductive pressure-sensitive adhesive tape described in <1> above, the electro-conductive particle may include a roughly spherical electro-conductive particle.

<3> In the electro-conductive pressure-sensitive adhesive tape described in <1> or <2> above, the electro-conductive particle may include large electro-conductive particles comprising particles with a particle size in a range from about 15 µm or more to about 50 µm or less, and small electro-conductive particles comprising particles with a particle size in a range from about 1 µm or more to about 12 µm or less, and a ratio (X1/X2) of a content (X1) of the large electro-conductive particles to a content (X2) of the small electro-conductive particles in the pressure-sensitive adhesive layer is 1.1 or more but 8.0 or less.

<4> In the electro-conductive pressure-sensitive adhesive tape described in <1> above, the pressure-sensitive adhesive layer may include an acrylic polymer as the resin component.

<5> In the electro-conductive pressure-sensitive adhesive tape described in <1> above, the resin component may include a polymerized product of a solventless-type pressure-sensitive adhesive composition.

<6> In the electro-conductive pressure-sensitive adhesive tape described in <1> above, the pressure-sensitive adhesive layer may have a thickness in a range from 15 µm or more to 100 µm or less.

<7> In the electro-conductive pressure-sensitive adhesive tape described in <1> above, the pressure-sensitive adhesive layer may have an electric resistance value smaller than 6 SΩ in thickness direction with an adhesive area of 5 mm×5 mm.

<8> In the electro-conductive pressure-sensitive adhesive tape described in <1> above, the pressure-sensitive adhesive layer may have pressure-sensitive adhesive force of at least 3 N/20 mm or more to an adherend made of SUS plate.

<9> An electronic member comprising an pressure-sensitive adhesive layer having conductivity, wherein the pressure-sensitive adhesive layer contains a resin component and an electro-conductive particle, the electro-conductive particle has at least one peak top existing in a particle size range from about 15 µm or more to about 50 µm or less and at least one further peak top existing in a particle size range from about 1 µm or more to about 12 µm or less in a particle size distribution curve thereof, the electro-conductive particle is contained in the pressure-sensitive adhesive layer in an amount of 40 mass % or more but 80 mass % or less, and the electro-conductive particle has a true density in a level of larger than zero but smaller than 8 g/cm³.

<10> In the electronic member described in <9> above, the pressure-sensitive adhesive layer may further contain polymerization initiator.

<11> In the electronic member described in <9> or <10> above, the electronic member may be a wiring board.

<12> In the electronic member described in <10> above, the polymerization initiator may include at least one selected from azo polymerization initiators, peroxide polymerization initiators, redox polymerization initiators, benzoin ether photopolymerization initiators, acetophenone photopolymerization initiators, α-ketol photopolymerization initiators, aromatic sulfonyl chloride photopolymerization initiators, photoactive oxime photopolymerization initiators, benzoin photopolymerization initiators, benzyl photopolymerization initiators, benzophenone photopolymerization initiators, ketal photopolymerization initiators, thioxanthone photopolymerization initiators, and acylphosphine oxide photo-polymerization initiators.

<13> A pressure-sensitive adhesive substantially consisting of an acrylic resin, an electro-conductive particle, and a polymerization initiator, wherein the electro-conductive particle has at least one peak top existing in a particle size range from about 15 µm or more to about 50 µm or less and at least one further peak top existing in a particle size range from about 1 µm or more to about 12 µm or less in a particle size distribution curve thereof, the electro-conductive particle is contained in the pressure-sensitive adhesive layer in an amount of 40 mass % or more but 80 mass % or less, and the electro-conductive particle has a true density in a level of larger than zero but smaller than 8 g/cm³.

<14> In the pressure-sensitive adhesive described in <13> above, the electro-conductive particle may include a roughly spherical electro-conductive particle.

<15> In the pressure-sensitive adhesive described in <13> or <14> above, a content of the acrylic resin over a total mass of the pressure-sensitive adhesive may be 20 mass % to 60 mass %.

<16> In the pressure-sensitive adhesive described in <13> above, the acrylic resin may include a polymer containing any of (meth)acrylic acid methyl, (meth)acrylic acid ethyl, (meth)acrylic acid n-butyl, (meth)acrylic acid isobutyl, (meth)acrylic acid s-butyl, (meth)acrylic acid t-butyl, (meth)acrylic acid hexyl, (meth)acrylic acid octyl, (meth)acrylic acid 2-ethylhexyl, (meth)acrylic acid isooctyl, (meth)acrylic acid nonyl, (meth)acrylic acid isononyl, (meth)acrylic acid decyl, and (meth)acrylic acid isodecyl as a monomer component.

<17> A pressure-sensitive adhesive substantially consisting of a resin, and an electro-conductive particle, wherein the electro-conductive particle has at least one peak top existing in a particle size range from about 15 μm or more to about 50 μm or less and at least one further peak top existing in a particle size range from about 1 μm or more to about 12 μm or less in a particle size distribution curve thereof, the electro-conductive particle is contained in the pressure-sensitive adhesive layer in an amount of 40 mass % or more but 80 mass % or less, and the electro-conductive particle is a glass or polymer particle coated with metal on its surface.

<18> In the pressure-sensitive adhesive described in <17> above, the pressure-sensitive adhesive may further contain polymerization initiator.

<19> In the pressure-sensitive adhesive described in <18> above, the polymerization initiator may include at least one selected from azo polymerization initiators, peroxide polymerization initiators, redox polymerization initiators, benzoin ether photopolymerization initiators, acetophenone photopolymerization initiators, α-ketol photopolymerization initiators, aromatic sulfonyl chloride photopolymerization initiators, photo active oxime photopolymerization initiators, benzoin photopolymerization initiators, benzyl photopolymerization initiators, benzophenone photopolymerization initiators, ketal photopolymerization initiators, thioxanthone photopolymerization initiators, and acylphosphine oxide photo-polymerization initiators.

<20> In the pressure-sensitive adhesive described in <17> above, the pressure-sensitive adhesive may further contain a polymer containing a polyfunctional monomer as a monomer component.

<21> In the pressure-sensitive adhesive described in <20> above, the polyfunctional monomer may contain any of hexanediol di(meth)acrylate, butanediol di(meth)acrylate, (poly)ethylene glycol di(meth)acrylate, (poly)propylene glycol di(meth)acrylate, neopentyl glycol di(meth)acrylate, pentaerythritol di(meth)acrylate, pentaerythritol tri(meth)acrylate, dipentaerythritol hexa(meth)acrylate, trimethylolpropane tri(meth)acrylate, tetramethylol methane tri(meth)acrylate, allyl(meth)acrylate, vinyl(meth)acrylate, divinylbenzene, epoxy acrylate, polyester acrylate, and urethane acrylate.

<22> In the pressure-sensitive adhesive described in <17> above, the resin may contain acrylic polymer.

<23> In the pressure-sensitive adhesive described in <22> above, the acrylic polymer may contain 50 mass % or more of either (meth)acrylic acid methyl, (meth)acrylic acid ethyl, (meth)acrylic acid n-butyl, (meth)acrylic acid isobutyl, (meth)acrylic acid s-butyl, (meth)acrylic acid t-butyl, (meth)acrylic acid hexyl, (meth)acrylic acid octyl, (meth)acrylic acid 2-ethylhexyl, (meth)acrylic acid isooctyl, (meth)acrylic acid nonyl, (meth)acrylic acid isononyl, (meth)acrylic acid decyl, or (meth)acrylic acid isodecyl as a monomer component.

<24> In the pressure-sensitive adhesive described in <17> above, the electro-conductive particle may include a roughly spherical electro-conductive particle.

<25> In the pressure-sensitive adhesive described in <17> above, the metal is any of nickel, iron, chromium, cobalt, aluminum, antimony, molybdenum, copper, silver, platinum, and gold.

An electro-conductive pressure-sensitive adhesive tape of this invention with the following feature is capable of securing sufficient conductivity and sufficient pressure-sensitive adhesive force even with a small adhesive area to an adherend.

EXAMPLES

Specific examples will be described in the following. It should be noted, however, that these examples are never construed to limit the scope of the present invention.

Example 1

(Preparation of Syrup)

Liquid monomer mixture (monomer composition) was prepared by mixing 63 parts by mass of isooctyl acrylate (iOA) and 7 parts by mass of acrylic acid (AA) together as monomer components. Then, 0.05 part by mass of IRGACURE 651 (2,2-dimethoxy-1,2-diphenylethane-1-one, manufactured by BASF Japan Ltd.) and 0.05 part by mass of IRGACURE 184 (1-hydroxycyclohexyl phenyl ketone, manufactured by BASF Japan Ltd.) were mixed into the liquid monomer mixture as photopolymerization initiators. Ultraviolet rays were applied to the mixture until the viscosity thereof became about 6.4 Pa·s (VISCOMETER (BH model), manufactured by TOKIMEC Co.). As a result, syrup (iOA/AA=90/10) containing a partial polymer (prepolymer) in which a part of the monomer components was polymerized was prepared.

(Preparation of Pressure-Sensitive Adhesive Composition I)

A pressure-sensitive adhesive composition I was prepared by adding 30 parts by mass of isooctyl acrylate (iOA), 0.06 part by mass of 1,6-hexanediol diacrylate (HDDA), 150 parts by mass of large electro-conductive particles (TP25S12, silver coated glass powder manufactured by Potters-Ballotini Co., Ltd., particle size at peak top in the particle size distribution curve: 26 μm, a particle size range: 18 μm to 35 μm, true density: 2.7 g/cm$^3$), and 50 parts by mass of small electro-conductive particles (ES-6000-S7N, silver coated glass powder, manufactured by Potters-Ballotini Co., Ltd.) to 100 parts by mass of the syrup, and by sufficiently mixing the syrup.

(Preparation of Electro-Conductive Pressure-Sensitive Adhesive Tape)

The pressure-sensitive adhesive composition I was applied to a releasable surface of a release liner and a coated layer was prepared. Another release liner was attached to the release liner such that the coated layer was sandwiched between the release liners. A polyethylene terephthalate substrate having a releasable surface on one surface thereof (Diafoil® MRE, having a thickness of 38 μm, manufactured by Mitsubishi Plastics Co., Ltd., or Diafoil® MRF, having a thickness of 38 μm, manufactured by Mitsubishi Plastics Co., Ltd.) was used as the release liners.

Ultraviolet rays were applied to both surfaces of the coated layer at illuminance intensity of 5 mW/cm$^2$ for 3 minutes to harden the coated layer and a pressure-sensitive adhesive layer having a thickness of 50 μm was prepared. BLACKLIGHT manufactured by TOSHIBA CORPORATION was used as a source of the ultraviolet rays. The illuminance intensity was adjusted using a UV checker (UVR-T1, manufactured by TOPCON CORPORATION) at the maximum sensitivity of 350 nm.

As described above, the electro-conductive pressure-sensitive adhesive tape (substrate-less electro-conductive double-sided pressure-sensitive adhesive tape having a laminate structure of: release liner/pressure-sensitive adhesive layer/release liner) of example 1 was prepared.

Thickness of the pressure-sensitive adhesive layer was measured by using a dial gauge specified in JIS B 7503. Contact faces of the dial gauge were set to be flat planes with 5 mm diameter. Thickness of a test sample of 150 mm wide was measured by the dial gauge with 1/1000 mm scale on five points at equal intervals width direction of the test sample, and the average of measurements is employed as a thickness of the pressure-sensitive adhesive layer. Thickness of pressure-sensitive adhesive layers in the following samples and comparative examples were measured in the same manner.

A particle size distribution curve (particle size range, particle size at peak top) was obtained according to the following procedure.

First, the pressure-sensitive adhesive layer of the electro-conductive pressure-sensitive adhesive layer was baked so as to retrieve the electro-conductive particles dispersed therein. SEM image (magnification: 600) of the retrieved electro-conductive particles was taken and then subjected to a computer analysis performed by using an image analysis software ("A-picture Kun®", manufactured by Asahi Kasei Engineering Co., Ltd.) to obtain data of the particles in the SEM image (e.g., particle size).

Conditions of the image analysis (circular analysis) were set as follows: scale for image transfer: 0.178571; particle brightness: bright; extraction means: auto/manual; processing speed: high; noise removing filter: on; display unit of result: µm; measuring diameter range: 2 µm-70 µm; circular threshold value: 10; overlapping value: 90. The results were properly manually corrected to add or delete a particle, when a fraction which is not particulate or some particles stuck together was regarded as one particle, in order to obtain a size for each particle. In figures used for analyses of the results, X-axis represents diameters whereas Y-axis represents numbers of particles.

Above-mentioned analysis was conducted ten times as a total at different points in the SEM image, and a particle size distribution curve of the electro-conductive particle (particle size range, particle size at peak top) were obtained through the average of the results.

The results showed that the large electro-conducive particles in the pressure-sensitive adhesive layer of the example 1 have a peak top at particle size of 26 µm in its particle size distribution curve, and with a particle size in a range from 18 µm to 35 µm. The small electro-conducive particles in the pressure-sensitive adhesive layer of the example 1 have a peak top at particle size of 6 µm in its particle size distribution curve, and with a particle size in a range from 2 µm to 10 µm. Size distribution curves for electro-conductive particles (particle size distribution range, particle size at peak top) utilized in the following samples and comparative examples were obtained in the same manner.

True density of the large electro-conductive particles was 2.7 g/cm$^3$, and that of the small electro-conductive particles was 3.9 g/cm$^3$. The true densities of both electro-conductive particles were obtained according to the method using a cross-sectional SEM image of each electro-conductive particle as described above. True densities of the electro-conductive particles utilized in the following samples and comparative examples were measured in the same manner.

Example 2

(Preparation of Syrup)

Liquid Monomer Mixture was Prepared by Mixing 82 Parts by mass of 2-ethylhexyl acrylate and 12 parts by mass of 2-methoxyethyl acrylate, together with polar group-containing monomers, 5 parts by mass of N-vinyl-2-pyrrolidone (NVP) and 1 part by mass of hydroxyethyl acrylamide (HEAA), as monomer components. Then, 0.05 part by mass of IRGACURE 651 (manufactured by BASF Japan Ltd.) and 0.05 part by mass of IRGACURE 184 (manufactured by BASF Japan Ltd.) were mixed into the liquid monomer mixture as photopolymerization initiators. Ultraviolet rays were applied to the mixture until the viscosity thereof became about 20 Pa·s (BH VISCOMETER, rotor: No. 5, 10 rpm, measuring temperature: 30° C.). As a result, syrup in which a part of the monomer components was polymerized was prepared.

(Preparation of Pressure-Sensitive Adhesive Composition II)

A pressure-sensitive adhesive composition II was prepared by adding 0.05 parts by mass of KAYARAD DPHA-40H (dipentaerythritol hexaacrylate, manufactured by Nippon Kayaku Co., Ltd.) as a polyfuntional monomer, 150 parts by mass of large electro-conductive particles (TP25S12, silver coated glass powder, manufactured by Potters-Ballotini Co., Ltd.), and 50 parts by mass of small electro-conductive particles (ES-6000-S7N, silver coated glass powder, manufactured by Potters-Ballotini Co., Ltd.) to 100 parts by mass of the syrup, and by sufficiently mixing the syrup.

(Preparation of Electro-Conductive Pressure-Sensitive Adhesive Tape)

Preparation of electro-conductive pressure-sensitive adhesive tape of example 2 (substrate-less electro-conductive double-sided pressure-sensitive adhesive tape having a laminate structure of: release liner/pressure-sensitive adhesive layer/release liner) was performed in the same manner as example 1 except for use of the pressure-sensitive adhesive composition II, which was used instead of the pressure-sensitive adhesive composition I.

Example 3

As shown in Tables 1A and 1B, preparation of electro-conductive pressure-sensitive adhesive tape of example 3 was performed in the same manner as example 1 except that the mixing amount of large electro-conductive particles was changed to 125 parts by mass.

Example 4

As shown in Tables 1A and 1B, preparation of electro-conductive pressure-sensitive adhesive tape of example 4 was performed in the same manner as example 2 except that the mixing amount of large electro-conductive particles was changed to 125 parts by mass.

Example 5

Preparation of electro-conductive pressure-sensitive adhesive tape of example 5 was performed in the same manner as example 1 except that the mixing amount of large electro-conductive particles was changed to 100 parts by mass.

Example 6

Preparation of electro-conductive pressure-sensitive adhesive tape of example 6 was performed in the same manner as example 2 except that the mixing amount of large electro-conductive particles was changed to 100 parts by mass.

Example 7

Preparation of electro-conductive pressure-sensitive adhesive tape of example 7 was performed in the same manner as example 1 except that 75 parts by mass of silver coated glass powder (TP35S12, manufactured by Potters-Ballotini Co., Ltd.) was used instead of 150 parts by mass of TP25S12 as large electro-conductive particles.

Example 8

Preparation of electro-conductive pressure-sensitive adhesive tape of example 8 was performed in the same manner as example 2 except that 75 parts by mass of silver coated glass powder (TP35S12, manufactured by Potters-Ballotini Co., Ltd., particle size at peak top in the particle size distribution curve: 37 μm, a particle size range: 25 μm to 43 μm, true density: 2.7 g/cm$^3$) was used instead of 150 parts by mass of TP25S12 as large electro-conductive particles.

Example 9

Preparation of electro-conductive pressure-sensitive adhesive tape of example 9 was performed in the same manner as example 7 except that the mixing amount of large electro-conductive particles was changed to 100 parts by mass.

Example 10

Preparation of electro-conductive pressure-sensitive adhesive tape of example 10 was performed in the same manner as example 8 except that the mixing amount of large electro-conductive particles was changed to 100 parts by mass.

Example 11

Preparation of electro-conductive pressure-sensitive adhesive tape of example 11 was performed in the same manner as example 7 except that the mixing amount of large electro-conductive particles was changed to 125 parts by mass, and the mixing amount of small electro-conductive particles was changed to 25 parts by mass.

Example 12

Preparation of electro-conductive pressure-sensitive adhesive tape of example 12 was performed in the same manner as example 8 except that the mixing amount of large electro-conductive particles was changed to 125 parts by mass, and the mixing amount of small electro-conductive particles was changed to 25 parts by mass.

Comparative Example 1

Preparation of electro-conductive pressure-sensitive adhesive tape was performed in the same manner as example 1 except that no small electro-conductive particle was used.

Comparative Example 2

Preparation of electro-conductive pressure-sensitive adhesive tape was performed in the same manner as example 2 except that no small electro-conductive particle was used.

Comparative Example 3

Preparation of electro-conductive pressure-sensitive adhesive tape was performed in the same manner as example 1 except that the mixing amount of large electro-conductive particle was changed to 200 parts by mass, and no small electro-conductive particle was used.

Comparative Example 4

Preparation of electro-conductive pressure-sensitive adhesive tape was performed in the same manner as example 2 except that the mixing amount of large electro-conductive particle was changed to 200 parts by mass, and no small electro-conductive particle was used.

Comparative Example 5

Preparation of an electro-conductive pressure-sensitive adhesive tape was tried in the same manner as example 1 except that the mixing amount of large electro-conductive particle was changed to 450 parts by mass, and no small electro-conductive particle was used. However, in this comparative example 5, a pressure-sensitive adhesive composition was incapable of forming a pressure-sensitive adhesive layer (namely, preparation of an electro-conductive pressure-sensitive adhesive tape) because of its excessively high viscosity.

Comparative Example 6

Preparation of an electro-conductive pressure-sensitive adhesive tape was tried in the same manner as example 2 except that the mixing amount of large electro-conductive particle was changed to 450 parts by mass, and no small electro-conductive particle was used. However, in this comparative example 6, a pressure-sensitive adhesive composition was incapable of forming a pressure-sensitive adhesive layer (namely, preparation of an electro-conductive pressure-sensitive adhesive tape) because of its excessively high viscosity.

[Evaluation] (180° Degree Peel Adhesion)

A sample of 20 mm wide×100 mm long was cut from each of the electro-conductive pressure-sensitive adhesive tapes prepared in the examples and comparative examples. One pressure-sensitive adhesive surface of the pressure-sensitive adhesive layer in the sample was attached to a SUS plate (SUS 304 plate) by moving a roller with 2.0 kg weight and 30 mm width back and forth for one time in an atmosphere of 23° C., 60% RH. The other pressure-sensitive adhesive surface of the pressure-sensitive adhesive layer was still covered with a release liner. The prepared sample was left still for 30 minutes at normal temperature (23° C., 60% RH) before subjected to 180° Degree Peel Adhesion Test by using a tensile testing machine based on JIS Z 0237 under drawing speed of 300 mm/min to measure the bonding strength on peeling (N/20 mm). Results are shown in Table 1C.

(Measuring Method 1 for Electric Resistance Values (Adhesive Area: 20 mm×20 mm))

Figure 6:
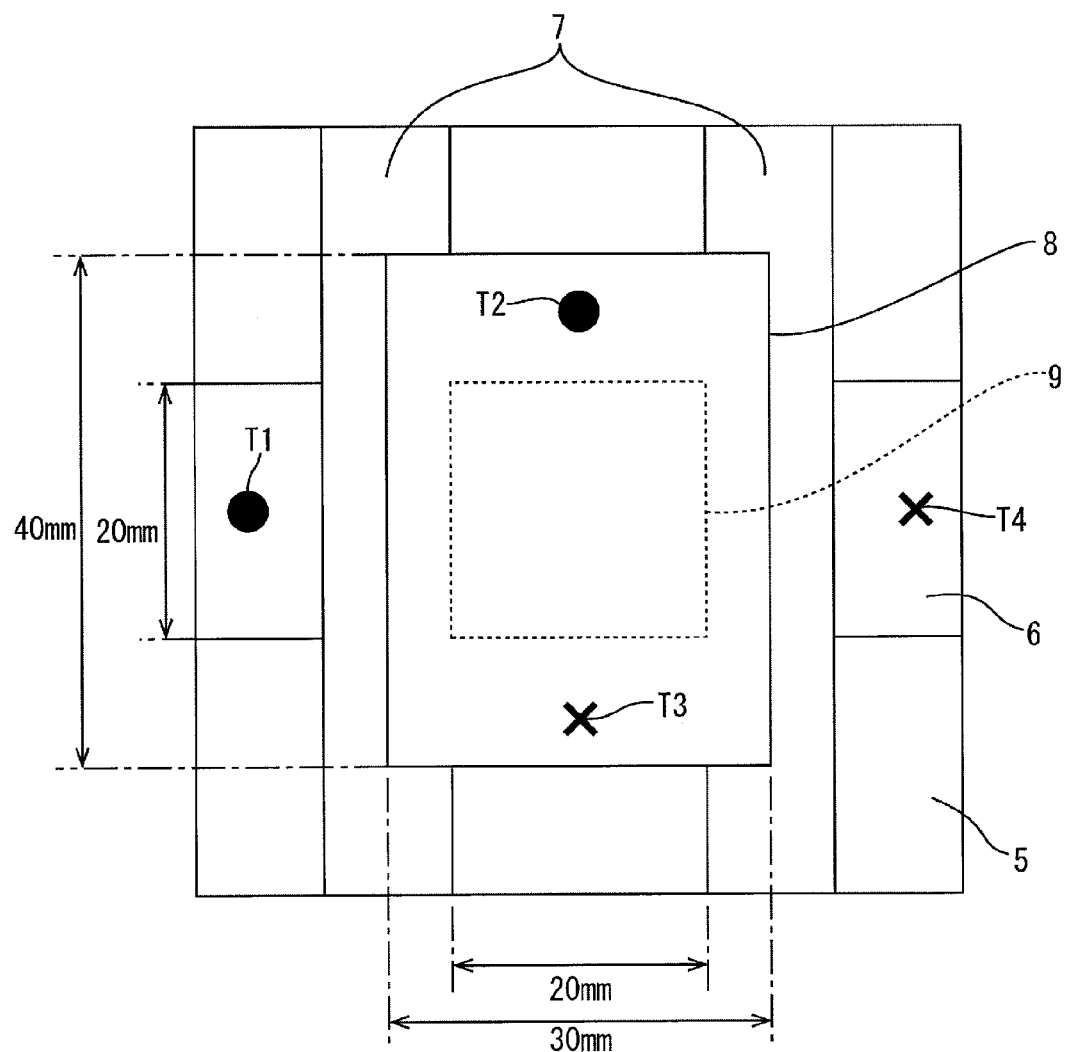
FIG. 6 is a schematic view illustrating a measuring method 1 for electric resistance values (adhesive area: 20 mm×20 mm).

A copper foil (rolled copper foil, thickness: 35 μm) was attached to any one of electro-conductive pressure-sensitive adhesive sheets obtained in examples and comparative examples, prior to cut a measurement sample of 30 mm wide×40 mm long from each of the sheets. A copper foil (rolled copper foil, thickness: 35 μm) 6 was placed on a glass plate (soda lime glass) 5, and insulating tapes —7 were laid on the copper foil 6 as shown in FIG. 6. Then, the measurement sample 8 prepared as described above was placed on the insulating tapes 7 and on the copper foil 6 as shown in FIG. 6. The copper foil 6 and the measuring sample 8 were affixed with each other on a laminated portion 9 (an area surrounded by the dotted lines in FIG. 6) of 4 cm$^2$ through compression bonding with a hand roller (30 mm wide) at a pressure of 5.0 N/cm in an atmosphere of ordinary temperature. The affixation was performed so that the vertical direction in FIG. 6 matched the longitudinal direction of the measuring sample 8, and the surface of the electro-conductive pressure-sensitive adhesive layer of the pressure-sensitive adhesive tape sample was in contact with the surface of the copper foil 6. After being affixed with each other, the sample was left stand in an atmosphere of ordinary temperature for 15 minutes before two terminals of an ohmmeter (RM3544-01, manufactured by HIOKI E.E. CORPORATION) were connected to end portions of the copper foil (at portions marked with T1 and T2 in FIG. 6) and the resistance between the terminals was measured. Results are shown in Table 1C.

(Measuring Method 2 for Electric Resistance Values (Adhesive Area: 10 mm×10 mm))

Figure 7:
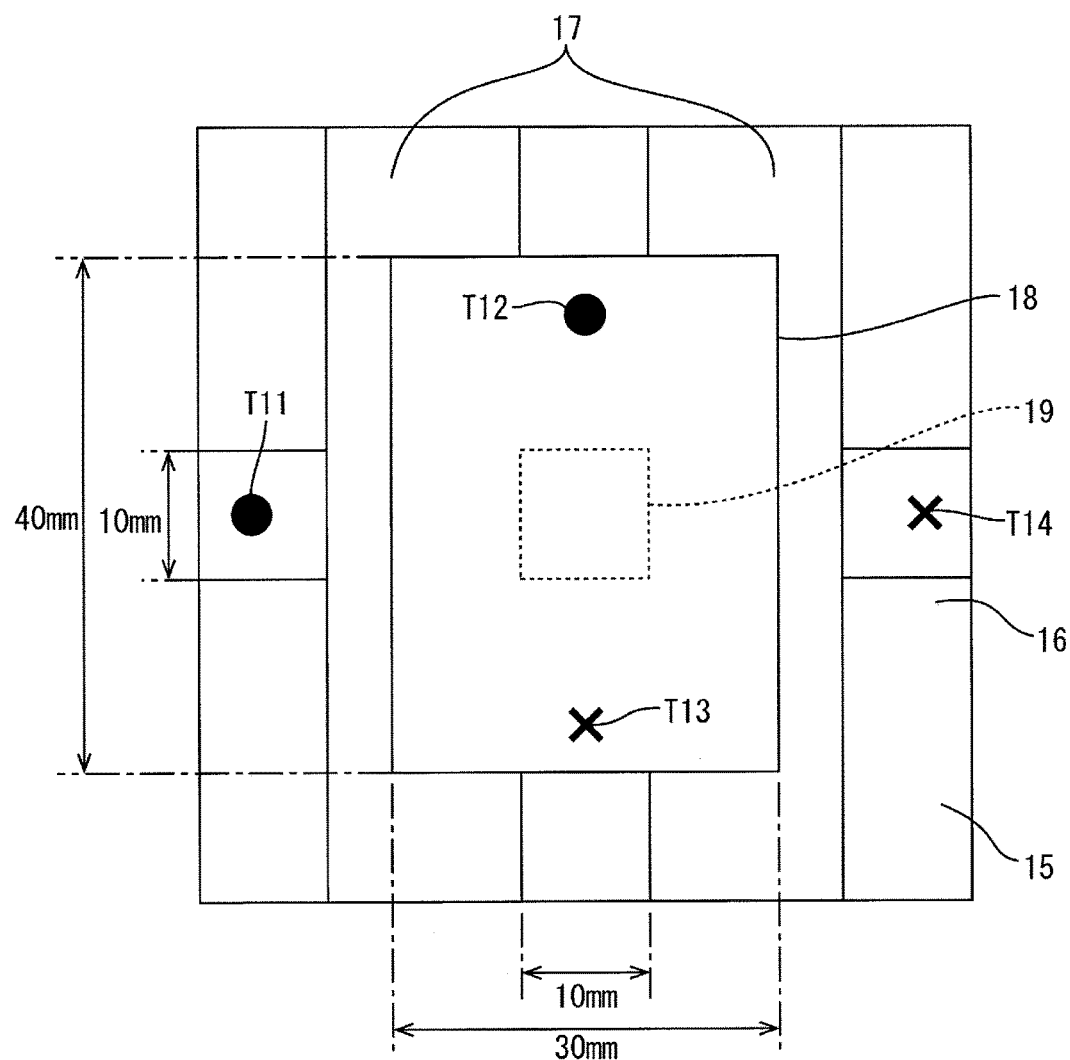
FIG. 7 is a schematic view illustrating a measuring method 2 for electric resistance values (adhesive area: 10 mm×10 mm).

A copper foil (rolled copper foil, thickness: 35 μm) was attached to any one of electro-conductive pressure-sensitive adhesive sheets obtained in examples and comparative examples, prior to cut a measurement sample of 30 mm wide×40 mm long from each of them. A copper foil (rolled copper foil, thickness 35 μm) 16 was placed on a glass plate (soda lime glass) 15, and insulating tapes 17 were laid on the copper foil 16 as shown in FIG. 7. Then, the measurement sample 18 prepared as described above was placed on the insulating tapes 17 and on the copper foil 16 as shown in FIG. 7. The copper foil 16 and the measuring sample 18 were affixed with each other on a laminated portion 19 (an area surrounded by the dotted lines in FIG. 7) of 1 cm$^2$ through compression bonding with a hand roller (30 mm wide) at a pressure of 5.0 N/cm in an atmosphere of ordinary temperature. The affixation was performed so that the vertical direction in FIG. 7 matched the longitudinal direction of the measuring sample 18, and the surface of the electro-conductive pressure-sensitive adhesive layer of the pressure-sensitive adhesive tape sample was in contact with the surface of the copper foil 16. After being affixed with each other, the sample was left stand in an atmosphere of ordinary temperature for 15 minutes before two terminals of an ohmmeter (RM3544-01, manufactured by HIOKI E.E. CORPORATION) were connected to end portions of the copper foil (at portions marked with T1 and T2 in FIG. 7) and the resistance between the terminals was measured. Results are shown in Table 1C.

(Measuring Method 3 for Electric Resistance Values (Adhesive Area: 5 mm×5 mm))

Figure 8:
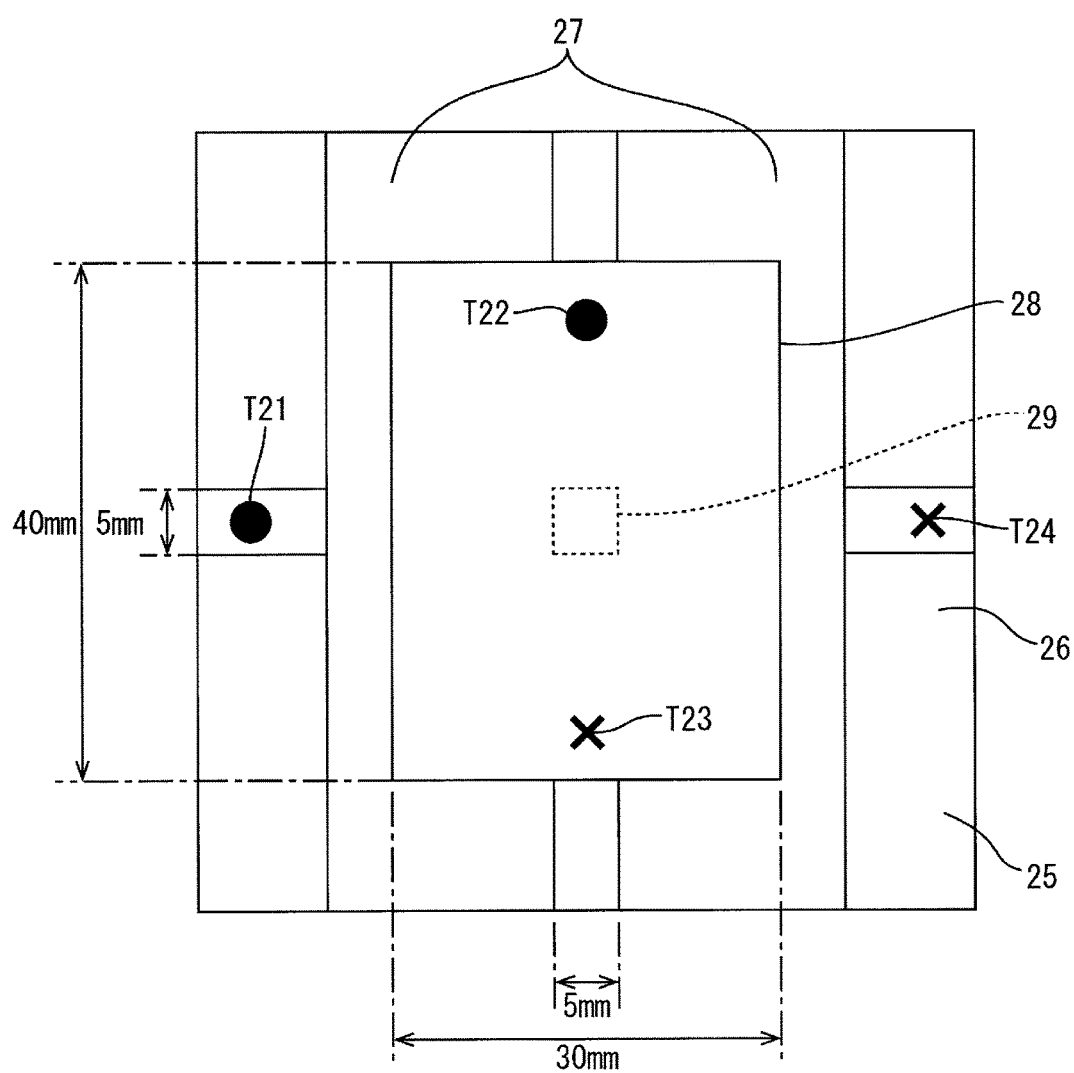
FIG. 8 is a schematic view illustrating a measuring method 3 for electric resistance values (adhesive area: 5 mm×5 mm).

A copper foil (rolled copper foil, thickness: 35 μm) was attached to any one of electro-conductive pressure-sensitive adhesive sheets obtained in examples and comparative examples, prior to cut a measurement sample of 30 mm wide×40 mm long from each of them. A copper foil (rolled copper foil, thickness 35 μm) 26 was placed on a glass plate 25 (soda lime glass) 25, and insulating tapes 27 were laid on the copper foil 26 as shown in FIG. 8. Then, the measurement sample 28 prepared as described above was placed on the insulating tapes 27 and on the copper foil 26 as shown in FIG. 8. The copper foil 26 and the measuring sample 28 were affixed with each other on a laminated portion 29 (an area surrounded by the dotted lines in FIG. 8) of 0.25 cm$^2$ through compression bonding with a hand roller (30 mm wide) at a pressure of 5.0 N/cm in an atmosphere of ordinary temperature. The affixation was performed so that the vertical direction in FIG. 8 matched the longitudinal direction of the measuring sample 28, and the surface of the electro-conductive pressure-sensitive adhesive layer of the pressure-sensitive adhesive tape sample was in contact with the surface of the copper foil 26. After being affixed with each other, the sample was left stand in an atmosphere of ordinary temperature for 15 minutes before two terminals of an ohmmeter (RM3544-01, manufactured by HIOKI E.E. CORPORATION) were connected to end portions of the copper foil (at portions marked with T1 and T2 in FIG. 8) and the resistance between the terminals was measured. Results are shown in Table 1C.

TABLE 1A

| | | RESIN COMPONENT MIXING AMOUNT (PARTS BY MASS) | | | | ELECTRO-CONDUCTIVE PARTICLES MIXING AMOUNT (PARTS BY MASS) | | | |
|---|---|---|---|---|---|---|---|---|---|
| | | iOA/AA = 90/10 | 2EHA/MEA/ NVP/HEAA = 80/11.5/7/1.5 | HDDA | DPHA | LARGE TP25 S12 | LARGE TP35 S12 | SMALL ES 6000 S7N | MIXING AMOUNT RATIO (LARGE/SMALL) |
| EXAMPLE | 1 | 100 | | 0.06 | | 150 | | 50 | 3.0 |
| | 2 | | 100 | | 0.06 | 150 | | 50 | 3.0 |
| | 3 | 100 | | 0.06 | | 125 | | 50 | 2.5 |
| | 4 | | 100 | | 0.06 | 125 | | 50 | 2.5 |
| | 5 | 100 | | 0.06 | | 100 | | 50 | 2.0 |
| | 6 | | 100 | | 0.06 | 100 | | 50 | 2.0 |
| | 7 | 100 | | 0.06 | | | 75 | 50 | 1.5 |
| | 8 | | 100 | | 0.06 | | 75 | 50 | 1.5 |
| | 9 | 100 | | 0.06 | | | 100 | 50 | 2.0 |
| | 10 | | 100 | | 0.06 | | 100 | 50 | 2.0 |
| | 11 | 100 | | 0.06 | | | 125 | 25 | 5.0 |
| | 12 | | 100 | | 0.06 | | 125 | 25 | 5.0 |
| COMPARATIVE EXAMPLE | 1 | 100 | | 0.06 | | 150 | | | |
| | 2 | | 100 | | 0.06 | 150 | | | |
| | 3 | 100 | | 0.06 | | 200 | | | |
| | 4 | | 100 | | 0.06 | 200 | | | |
| | 5 | 100 | | 0.06 | | 450 | | | |
| | 6 | | 100 | | 0.06 | 450 | | | |

TABLE 1B

PRESSURE-SENSITIVE ADHESIVE LAYER

ELECTRO-CONDUCTIVE PARTICLE

| | | | LARGE ELECTRO-CONDUCTIVE PARTICLE | | | SMALL ELECTRO-CONDUCTIVE PARTICLE | | | |
|---|---|---|---|---|---|---|---|---|---|
| | | CONTENT (wt %) | PARTICLE SIZE AT PEAK TOP (μm) | PARTICLE SIZE DISTRIBUTION RANGE (μm) | TRUE DENSITY (g/cm³) | PARTICLE SIZE AT PEAK TOP (μm) | PARTICLE SIZE DISTRIBUTION RANGE (μm) | TRUE DENSITY (g/cm³) | THICKNESS (μm) |
| EXAMPLE | 1 | 66.7 | 26 | 18-35 | 2.7 | 6 | 2-10 | 3.9 | 50 |
| | 2 | 66.7 | 26 | 18-35 | 2.7 | 6 | 2-10 | 3.9 | 50 |
| | 3 | 63.6 | 26 | 18-35 | 2.7 | 6 | 2-10 | 3.9 | 50 |
| | 4 | 63.6 | 26 | 18-35 | 2.7 | 6 | 2-10 | 3.9 | 50 |
| | 5 | 60.0 | 26 | 18-35 | 2.7 | 6 | 2-10 | 3.9 | 50 |
| | 6 | 60.0 | 26 | 18-35 | 2.7 | 6 | 2-10 | 3.9 | 50 |
| | 7 | 55.5 | 37 | 25-43 | 2.7 | 6 | 2-10 | 3.9 | 50 |
| | 8 | 55.5 | 37 | 25-43 | 2.7 | 6 | 2-10 | 3.9 | 50 |
| | 9 | 60.0 | 37 | 25-43 | 2.7 | 6 | 2-10 | 3.9 | 50 |
| | 10 | 60.0 | 37 | 25-43 | 2.7 | 6 | 2-10 | 3.9 | 50 |
| | 11 | 60.0 | 37 | 25-43 | 2.7 | 6 | 2-10 | 3.9 | 50 |
| | 12 | 60.0 | 37 | 25-43 | 2.7 | 6 | 2-10 | 3.9 | 50 |
| COMPARATIVE EXAMPLE | 1 | 60.0 | 26 | 18-35 | 2.7 | | | | 50 |
| | 2 | 60.0 | 26 | 18-35 | 2.7 | | | | 50 |
| | 3 | 66.7 | 26 | 18-35 | 2.7 | | | | 50 |
| | 4 | 66.6 | 26 | 18-35 | 2.7 | | | | 50 |
| | 5 | 81.8 | 26 | 18-35 | 2.7 | | | | NOT MEASURED |
| | 6 | 81.8 | 26 | 18-35 | 2.7 | | | | NOT MEASURED |

TABLE 1C

| | | EVALUATION | | | |
|---|---|---|---|---|---|
| | | PRESSURE-SENSITIVE ADHESIVE FORCE (n/20 mm) | ELECTRIC RESISTANCE VALUE (Ω) | | |
| | | 20 × 100 mm | 20 × 20 mm | 10 × 10 mm | 5 × 5 mm |
| EXAMPLE | 1 | 7.0 | 0.02 | 0.13 | 0.50 |
| | 2 | 8.0 | 0.02 | 0.13 | 0.50 |
| | 3 | 6.0 | 0.03 | 0.15 | 0.75 |
| | 4 | 6.5 | 0.03 | 0.15 | 0.75 |
| | 5 | 5.5 | 0.04 | 0.19 | 1.05 |
| | 6 | 6.0 | 0.04 | 0.19 | 1.05 |
| | 7 | 5.5 | 0.07 | 0.15 | 3.00 |
| | 8 | 6.0 | 0.07 | 0.15 | 3.00 |
| | 9 | 6.0 | 0.07 | 0.17 | 2.50 |
| | 10 | 6.5 | 0.07 | 0.17 | 2.50 |
| | 11 | 7.5 | 0.10 | 0.14 | 1.85 |
| | 12 | 8.0 | 0.10 | 0.14 | 1.85 |
| COMPARATIVE EXAMPLE | 1 | 10.0 | 0.25 | 1.00 | 6.00 |
| | 2 | 10.0 | 0.25 | 1.00 | 6.00 |
| | 3 | 10.5 | 0.20 | 0.80 | 5.00 |
| | 4 | 10.5 | 0.20 | 0.80 | 5.00 |
| | 5 | INCAPABLE OF FORMING TAPE | | | |
| | 6 | INCAPABLE OF FORMING TAPE | | | |

As shown in Table 1C, the pressure-sensitive adhesive tapes of examples 1 to 12 have sufficient pressure-sensitive adhesive force even with a small adhesive area to an adherend (SUS plate). The pressure-sensitive adhesive tapes of examples 1 to 12 showed small electric resistance values with an adhesive area of 20 mm×20 mm, with an adhesive area of 10 mm×10 mm, and with an adhesive area of 5 mm×5 mm, indicating sufficient conductivity in thickness direction of the pressure-sensitive adhesive layer. It implies that the electro-conductive particles (mixtures of large electro-conductive particles and small electro-conductive particles) in the pressure-sensitive adhesive layers efficiently form electro-conductive paths in thickness direction of the pressure-sensitive adhesive layers without decreasing pressure-sensitive adhesive force of the pressure-sensitive adhesive layer in the electro-conductive pressure-sensitive adhesive tapes of examples 1 to 12.

Compared to this, the electro-conductive pressure-sensitive adhesive tapes of comparative examples 1 to 4 have sufficient pressure-sensitive adhesive force, but do not have conductivity as good as those of the electro-conductive pressure-sensitive adhesive tapes of examples 1 to 12. Concretely, all the electro-conductive pressure-sensitive adhesive tapes of comparative examples 1 to 4 showed higher electric resistance values than those of examples 1 to 12, in measuring method 1 for electric resistance values (adhesive area: 20 mm×20 mm), indicating poor conductivity. Further, all the electro-conductive pressure-sensitive adhesive tapes of comparative examples 1 to 4 showed higher electric resistance values than those of examples 1 to 12, also in measuring method 2 (with adhesive area: 10 mm×10 mm) and measuring method 3 (with adhesive area: 5 mm×5 mm) for electric resistance values, indicating poor conductivity. Pressure-sensitive adhesive force and electric resistance values of the electro-conductive pressure-sensitive adhesive tapes of comparative examples 5 and 6 were not evaluated since pressure-sensitive adhesive layers of them could not have formed as described above.

The invention claimed is:
1. An electro-conductive pressure-sensitive adhesive tape comprising a pressure-sensitive adhesive layer, wherein
the pressure-sensitive adhesive layer contains a resin component and electro-conductive particles,
the electro-conductive particles are spherical,
the electro-conductive particles have at least one peak top existing in a particle size range from about 15 μm or more to about 50 μm or less, and at least one further peak top existing in a particle size range from about 1 μm or more to about 12 μm or less in a particle size distribution curve thereof, the electro-conductive particles are contained in the pressure-sensitive adhesive layer in an amount of 55.5% or more but 80 mass % or less, and the electro-conductive particles have true densities in a level of larger than zero but smaller than 8 g/cm$^3$, the electro-conductive particles are glass or polymer particles coated with metal on surfaces of the glass or polymer particles, the electro-conductive particles include large electro-conductive particles comprising particles with a particle size in a range from about 15 μm or more to about 50 μm or less, and small electro-conductive particles comprising particles with a particle size in a range from about 1 μm or more to about 12 μm or less, and a ratio (X1/X2) of a content (X1) of the large electro-conductive particles to a content (X2) of the small electro-conductive particles in the pressure-sensitive adhesive layer is 1.1 or more but 8.0 or less.

2. The electro-conductive pressure-sensitive adhesive tape according to claim 1, wherein the pressure-sensitive adhesive layer includes an acrylic resin as the resin component.

3. The electro-conductive pressure-sensitive adhesive tape according to claim 2, wherein a content of the acrylic resin over a total mass of the pressure-sensitive adhesive is 20 mass % to 60 mass %.

4. The electro-conductive pressure-sensitive adhesive tape according to claim 2, wherein the acrylic resin includes a polymer containing any of (meth)acrylic acid methyl, (meth)acrylic acid ethyl, (meth)acrylic acid n-butyl, (meth)acrylic acid isobutyl, (meth)acrylic acid s-butyl, (meth)acrylic acid t-butyl, (meth)acrylic acid hexyl, (meth)acrylic acid octyl, (meth)acrylic acid 2-ethylhexyl, (meth)acrylic acid isooctyl, (meth)acrylic acid nonyl, (meth)acrylic acid isononyl, (meth)acrylic acid decyl, and (meth)acrylic acid isodecyl as a monomer component.

5. The electro-conductive pressure-sensitive adhesive tape according to claim 1, wherein the pressure-sensitive adhesive layer further contains polymerization initiator.

6. The electro-conductive pressure-sensitive adhesive tape according to claim 5, wherein the polymerization initiator includes at least one selected from azo polymerization initiators, peroxide polymerization initiators, redox polymerization initiators, benzoin ether photopolymerization initiators, acetophenone photopolymerization initiators, α-ketol photopolymerization initiators, aromatic sulfonyl chloride photopolymerization initiators, photoactive oxime photopolymerization initiators, benzoin photopolymerization initiators, benzyl photopolymerization initiators, benzophenone photopolymerization initiators, ketal photopolymerization initiators, thioxanthone photopolymerization initiators, and acylphosphine oxide photo-polymerization initiators.

7. The electro-conductive pressure-sensitive adhesive tape according to claim 1, wherein the resin component includes a polymerized product of a solventless pressure-sensitive adhesive composition.

8. The electro-conductive pressure-sensitive adhesive tape according to claim 1, wherein the pressure-sensitive adhesive further contains a polymer containing a polyfunctional monomer as a monomer component.

9. The electro-conductive pressure-sensitive adhesive tape according to claim 8, wherein the polyfunctional monomer contains any of hexanediol di(meth)acrylate, butanediol di(meth)acrylate, (poly)ethylene glycol di(meth)acrylate, (poly)propylene glycol di(meth)acrylate, neopentyl glycol di(meth)acrylate, pentaerythritol di(meth)acrylate, pentaerythritol tri(meth)acrylate, dipentaerythritol hexa(meth)acrylate, trimethylolpropane tri(meth)acrylate, tetramethylol methane tri(meth)acrylate, allyl(meth)acrylate, vinyl(meth)acrylate, divinylbenzene, epoxy acrylate, polyester acrylate, and urethane acrylate.

10. The electro-conductive pressure-sensitive adhesive tape according to claim 1, wherein the pressure-sensitive adhesive layer has a thickness in a range from 15 μm or more to 100 μm or less.

11. The electro-conductive pressure-sensitive adhesive tape according to claim 1, wherein the pressure-sensitive adhesive layer has an electric resistance value smaller than 6Ω in thickness direction with an adhesive area of 5 mm×5 mm.

12. The electro-conductive pressure-sensitive adhesive tape according to claim 1, wherein the pressure-sensitive adhesive layer has pressure-sensitive adhesive force of at least 3 N/20 mm or more to an adherend made of SUS plate.

13. The electro-conductive pressure-sensitive adhesive tape according to claim 1, wherein the metal is any of nickel, iron, chromium, cobalt, aluminum, antimony, molybdenum, copper, silver, platinum, and gold.

14. The electro-conductive pressure-sensitive adhesive tape according to claim 1, wherein the large electro-conductive particles have true densities in a level of 2.7 g/cm$^3$ or more but smaller than 8 g/cm$^3$, and the small electro-conductive particles have true densities in a level of 3.9 g/cm$^3$ or more but smaller than 8 g/cm$^3$.

15. The electro-conductive pressure-sensitive adhesive tape according to claim 1, wherein the pressure-sensitive adhesive layer has an electric resistance value smaller than 6Ω in thickness direction with an adhesive area of 5 mm×5 mm, and pressure-sensitive adhesive force of at least 3 N/20 mm or more to an adherend made of SUS plate.

* * * * *